United States Patent
Neogi et al.

(10) Patent No.: US 7,666,579 B1
(45) Date of Patent: Feb. 23, 2010

(54) METHOD AND APPARATUS FOR HIGH DENSITY STORAGE OF ANALOG DATA IN A DURABLE MEDIUM

(75) Inventors: Suneeta Neogi, Temecula, CA (US); Jayant Neogi, Temecula, CA (US)

(73) Assignee: Serenity Technologies, Inc., Temecula, CA (US)

( * ) Notice: Subject to any disclaimer, the term of this patent is extended or adjusted under 35 U.S.C. 154(b) by 1399 days.

(21) Appl. No.: 10/245,863

(22) Filed: Sep. 16, 2002

Related U.S. Application Data

(60) Provisional application No. 60/323,179, filed on Sep. 17, 2001.

(51) Int. Cl.
*G03F 1/00* (2006.01)

(52) U.S. Cl. .................. 430/322; 430/5; 430/296; 430/323; 205/70

(58) Field of Classification Search .......... 430/322, 430/323, 324, 327, 302, 307, 296, 5, 13, 430/8, 16, 24, 22, 309, 310; 101/463.1, 46, 101/469; 205/69, 70; 427/108
See application file for complete search history.

(56) References Cited

U.S. PATENT DOCUMENTS

| | | | |
|---|---|---|---|
| 3,877,810 A * | 4/1975 | Feldstein | 355/133 |
| 4,346,449 A * | 8/1982 | Ovshinsky et al. | 219/216 |
| 4,362,807 A * | 12/1982 | Sato | 430/276.1 |
| 4,532,528 A * | 7/1985 | Lee | 346/135.1 |
| 4,729,940 A * | 3/1988 | Nee et al. | 205/655 |
| 4,739,414 A * | 4/1988 | Pryor et al. | 358/482 |
| 4,797,316 A * | 1/1989 | Hecq et al. | 428/167 |
| 4,861,699 A * | 8/1989 | Wijdenes et al. | 430/321 |
| 5,145,757 A * | 9/1992 | Smoot et al. | 430/5 |
| 5,166,014 A * | 11/1992 | Ledieu | 430/16 |
| 5,314,768 A * | 5/1994 | Sethi | 430/5 |
| 5,492,769 A * | 2/1996 | Pryor et al. | 428/552 |
| 5,686,228 A * | 11/1997 | Murray et al. | 430/350 |
| 5,879,856 A * | 3/1999 | Thackeray et al. | 430/270.1 |
| 6,534,221 B2 * | 3/2003 | Lee et al. | 430/5 |
| 6,613,498 B1 * | 9/2003 | Brown et al. | 430/322 |

FOREIGN PATENT DOCUMENTS

WO 00/76583 A1 12/2000

\* cited by examiner

*Primary Examiner*—Thorl Chea
(74) *Attorney, Agent, or Firm*—Marger Johnson & McCollom, P.C.

(57) ABSTRACT

Analog data such as text and images are stored in microscopic analog format on a disk surface capable of maintaining the information for 1000 years or more whereby simple optical magnification will result in one being able to read the information formed therein. For a disk read by backlighting, as with microfiche, a photosensitive material is overlayed on hard metal surface which in turn is formed on a transparent glass or quartz material. A laser beam is focused on certain desired portions of the photosensitive material and the exposed material and underlying hard metal layer etched off to form pits down to the transparent layer corresponding to the analog information. The resulting disk can then be used to produce archival copies and distribution copies using hot embossing or other disclosed techniques.

8 Claims, 15 Drawing Sheets

Gettysburg Address
by Abraham Lincoln

Fourscore and seven years ago our fathers brought forth on this continent a new nation, conceived in liberty and dedicated to the proposition that all men are created equal. Now we are engaged in a great civil war, testing whether that nation or any nation so conceived and so dedicated can long endure. We are met on a great battlefield of that war. We have come to dedicate a portion of that field as a final resting-place for those who here gave their lives that that nation might live. It is altogether fitting and proper that we should do this. But in a larger sense, we cannot dedicate, we cannot consecrate, we cannot hallow this ground. The brave men, living and dead who struggled here have consecrated it far above our poor power to add or detract. The world will little note nor long remember what we say here, but it can never forget what they did here. It is for us the living rather to be dedicated here to the unfinished work which they who fought here have thus far so nobly advanced. It is rather for us to be here dedicated to the great task remaining before us--that from these honored dead we take increased devotion to that cause for which they gave the last full measure of devotion--that we here highly resolve that these dead shall not have died in vain, that this nation under God shall have a new birth of freedom, and that government of the people, by the people, for the people shall not perish from the earth.

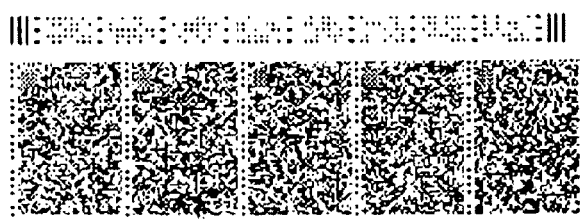

FIG. 1

METHOD AND APPARATUS FOR HIGH DENSITY STORAGE OF ANALOG DATA IN A DURABLE MEDIUM

CROSS-REFERENCES TO RELATED APPLICATIONS

This application claims the benefit from U.S. Provisional Patent Application No. 60/323,179 filed Sep. 17, 2001 whose contents are incorporated herein for all purposes.

BACKGROUND OF THE INVENTION

1. Field of the Invention

This invention relates generally to archival methods and more particularly to a method and apparatus for physically defining analog data on a durable medium for long term storage and retrieval using processing techniques related to those used in semiconductor manufacturing.

2. Description of the Prior Art

Recently, international attention has been focused on the subject of "Analog Data Storage" i.e. storage of text and images in the analog format on durable media. The storage format is such that retrieval of the data only requires magnification of the data onto a viewing screen using simple optical methods, akin to the process currently used for the viewing of microfiche.

Although Microfiche/microfilms are the current accepted method for analog archival of data, this technology does not serve the purpose of truly long term archival. Microfiche/microfilms require special environmental conditions for storage of the film. Accordingly, Microfiche is not a durable medium for archival storage over long periods of time. Secondly, microfiche/microfilms degrade despite environmental controls in as short a span as 30-50 years thus requiring re-copying onto new film. Re-copying leads to some loss of data due to degradation of resolution. Thus the current technology available for analog data storage for archival purposes does not provide long-term (>1000 years) storage of data on durable media capable of withstanding all forms of corrosive environments. Additionally, storage of data on microfilms becomes expensive in the long run because of the need for environmental controls and re-copying at the media end of life.

Archivists look to analog storage of data because they are concerned with preservation of text and images over time measured in millennia. Furthermore, archivists desire that the retrieval of the data should not be dependent on software or hardware devices such as the case for digital storage of data.

The industry has made big strides in digital storage of data where relatively high densities of data can be stored in various media such as compact discs, digital versatile discs, storage drives etc. and can be retrieved at extremely high speeds using computing software/hardware. The key problem in this form data storage is that it is dependent on the digital technology available at any given time and suffers from software/hardware obsolescence in relatively short time spans. A good example is the 5¼ floppy storage disc and reader both of which were commonly in use for digital data storage in the 1970s and 80s. Today this form of storage does not exist and has been replaced by other digital storage devices capable of higher densities.

Accordingly, the need remains for an improved method for implementing archival storage and retrieval of analog data.

SUMMARY OF THE INVENTION

There are several recognized drawbacks to prior art archival storage and retrieval methods that the present invention is designed to address. Objects that the methods and apparatus described herein are designed to achieve include:

1. Any analog data storage process should be a very inexpensive process and should use relatively inexpensive apparatus (writer and reader).
2. The medium on which the data is stored should be capable of withstanding harsh corrosive environments in order to ensure its durability over time periods exceeding a thousand years.
3. The data should be capable of easy retrieval for viewing using simple optical methods for magnification. This would require the depth of the features marked on the durable substrates to be optimized in the range of 400-600 nm deep. This ensures that the data could be read without having to rely on sophisticated retrieval mechanisms.
4. The process for storage of the data should be 100% reliable and there should be no loss of information, quality or resolution during the archival process.
5. The method of storage of analog data should be capable of allowing a mixture of text and images to be stored together. A combination of analog data for long term storage/archival and digital data for fast rapid access of data could be an ideal archival implementation.
6. The process and method for storing image information should be capable of incorporating at least 20 levels of gray (maximum gray levels distinguishable by human eye) such that grayscale images can be stored at high resolution.
7. The method should be extendable to allow storage of color images.
8. The method should allow creation of archival copies as well as relatively inexpensive distribution copies.
9. The apparatus used for storing the data on a durable media should be low maintenance and not require special facilities to allow easy setup in what could be envisioned as archival service centers.

A method and apparatus for analog data storage on durable media according to a preferred embodiment of the invention is described as follows. To make this process inexpensive, portable and not requiring any stringent operating conditions like vibration control, high vacuum, etc., a high resolution laser lithography (DWL or "Direct Write Laser") system is used to create a mask containing the analog (or digital) information similar to the creation of pattern masks using lithography techniques for the semiconductor industry for IC fabrication. The use of e-beam lithography is also contemplated, where e-beam technology (though generally more expensive) can be used to create pattern masks of very high data density. As used herein, the process described for data storage (analog/digital) will be referred to as "permafiche".

One method for storing analog data on a medium comprising the steps of first providing a blank permafiche substrate comprising a transparent substrate, an opaque hard mask layer over the transparent substrate, and a photoresist layer over the hard mask layer. Portions of the photoresist layer are then exposed to directed energy only at predefined pixel locations corresponding to a reduced image of the analog data. Then, either the exposed portions or the unexposed portions of the photoresist are removed (depending upon whether the photoresist used is "positive" where exposed portions are removed, or "negative" where the exposed portions remain) to thereby uncover corresponding portions of the hard mask layer located beneath the removed exposed/unexposed portions. The uncovered corresponding portions of the hard mask layer are then etched to thereby uncover corresponding portions of the transparent substrate located beneath the etched portions of the hard mask layer. Finally, the photoresist layer is removed to yield a copy master having remaining opaque portions and uncovered transparent portions over which the opaque hard mask layer has been removed.

An archival master, using a blank permafiche substrate comprising an archival substrate such as nickel of any other durable material including but not limited to diamond, and a photoresist layer, is produced by similar steps to those above except that the analog information is etched as a pattern, containing three dimensional surface features, directly into the archival substrate once the exposed/unexposed portions of the photoresist are removed.

Another method for creating analog data in three dimensions in the surface of a substrate include first exposing portions of an energy sensitive glass substrate to a dose of directed energy only at predefined pixel locations corresponding to a reduced image of the analog data to form a gray level mask pattern. The gray level mask pattern formed within the glass substrate is then used to transmit the gray level mask pattern to a photoresist layer formed over a substrate. Finally, portions of the photoresist layer corresponding to the gray level mask pattern are removed to form a three dimensional representation of the optical data within the photoresist layer.

Yet another method for creating analog data in three dimensions in the surface of a substrate involves the use of microfilm to make the analog data etching pattern in the permafiche substrate. The method uses blank permafiche distribution substrate comprising a photosensitive polymer layer and a durable substrate layer. The microfilm, including transparent and/or partially transparent portions, is interposed between the photosensitive polymer layer of the blank permafiche distribution substrate and an ultraviolet (UV) source. The photosensitive polymer is then exposed to the UV source through the microfilm to yield exposed polymer portions aligned with the transparent or partially transparent portions in the microfilm. Finally, the exposed portions or the unexposed portions (depending upon whether the polymer layer is positive or negative) are removed to thereby uncover corresponding portions of the durable substrate layer located beneath the removed exposed/unexposed portions to form three-dimensional features within the distribution substrate corresponding to the analog data on the microfilm.

Distribution copies can be formed from the copy master by several disclosed methods. One such preferred method involves forcing a surface of the substrate containing the three dimensional surface features in contact with a temperature sensitive polymer under low vacuum and at a temperature higher than the glass transition temperature of the polymer. This results in a negative transfer of the three-dimensional surface features onto the polymer. The surface and polymer are selected to have different thermal expansion rates. The polymer is allowed to solidify and shrink during a cooling process, as when cooling down to room temperature, to effect a release of the polymer from the substrate surface. Finally, the shaped polymer surface is coated with a high contrast material, thereby producing a negative copy of the three-dimensional surface features.

Another method for forming distribution copies uses vinyl polysiloxane that sets and shrinks to effect release from the substrate. Metal can then be electroplated onto the polymer surface and the metal separated to form the metal copy of the analog data.

Finally, analog data can be inscribed on substrates by direct milling methods such as directed laser beams. Another method, using e-beams exposes the substrate to a corrosive gas such as xenon difluoride and then bombarding portions of the exposed substrate with a directed high-energy electron beam to effect localized etching of the substrate at the portions.

The foregoing and other objects, features and advantages of the invention will become more readily apparent from the following detailed description of a preferred embodiment of the invention that proceeds with reference to the accompanying drawings.

BRIEF DESCRIPTION OF THE DRAWINGS

FIG. 1 is an illustration of one page of text that contains a digital code pattern in the footer which, upon digital decoding, displays the text information.

DETAILED DESCRIPTION

Figure 2:
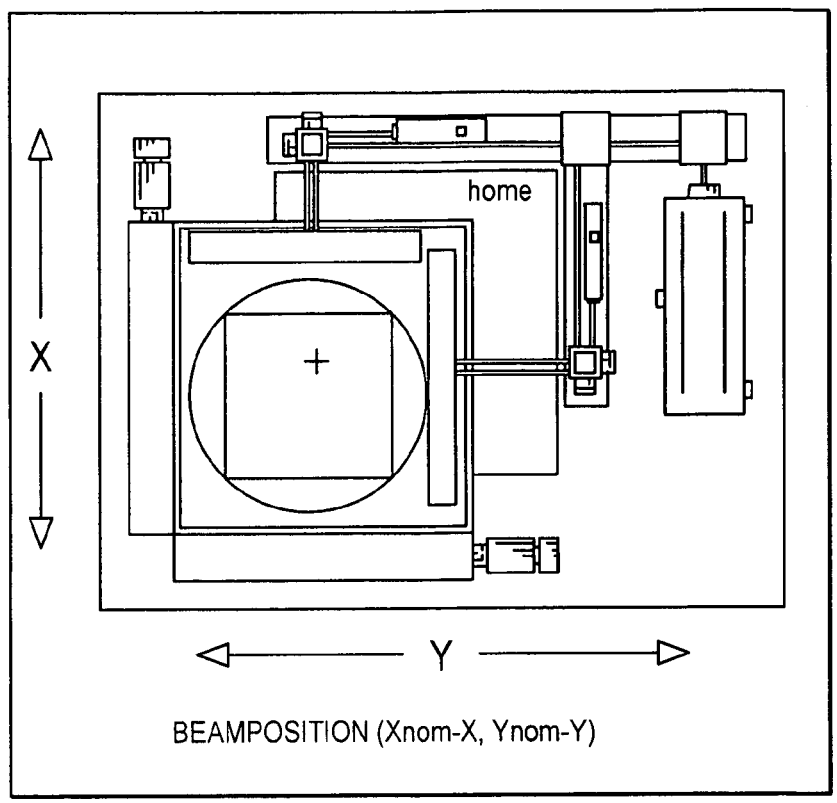
FIG. 2 is a schematic diagram of the laser optics and stage system used to produce an archival substrate in a laser-etching machine, according to a preferred embodiment of the invention.

Analog data storage using focused ion beam (FIB) technology has been introduced in the recent years. The focused ion beam system is the apparatus used for marking special substrates with data in the form of text or images. Unfortunately, archival methods using focused ion beam technology would not provide a low-cost, 100% reliable, high volume archival storage solution due to several key problems. In brief, the drawbacks to FIB archival methods include very high system cost, a requirement for use with special facilities such as vibration isolation, vacuum etc., high maintenance cost, special operator training, long writing times, expensive support equipment for post-processing, and transfer of information into archival quality substrates. Finally and perhaps most importantly, focused ion beam systems do not ensure 100% accurate transfer of data to the storage medium and are thus not suitable for high volume, production environments.

The FIB is a specialized tool, which has some key applications in the semiconductor industry such as circuit edit, mask repair and failure analysis. The FIBs require constant monitoring to ensure smooth operation and require setting up of service agreements with the manufacturer to maintain the tool. When the FIB is used as a writer to transfer data in the form of text to the substrate, the depth of features of the transferred pattern are in the sub-60 nanometer range. There are two key disadvantages to having such shallow features: (1) specialized optics need to be incorporated into the reader in order to resolve the data, and (2) special care is needed to avoid accidentally losing the data from minor scratching.

Another disadvantage of focused ion beam lithography techniques for archival purposes is that writing on materials including a transparent base layer (for backlit viewing as with standard microfiche machines) is extremely complicated.

The invention contemplates advances made in direct write laser (DWL), focused ion beam (FIB) and e-beam technologies for use as the directed energy used to form the three dimensional structures illustrating the analog data. Currently, however, using a DWL system instead of using other sophisticated equipment such as a focused ion beam systems incurs several advantages. In recent years analog data storage using focused ion beam technology has gained a lot of attention although a complete low cost solution using this technology is yet to be developed. Several key problems that stand in the way of making this a viable technology are described elsewhere in this document.

Analog data stored on suitable media using the DWL technique is read by magnification of the patterns on the analog media using simple optical methods and displaying the pattern on a screen (computer screen, TV monitor, or direct viewing of the image through a binocular lens). Although the analog form of data storage is the key requirement of archival applications, an additional feature that can be incorporated into the data that is stored on the durable media is the addition of digitally encoded information such that the data can be rapidly accessed using appropriate decoding software for day to day access and distribution of information that is stored on the "permafiche".

The illustration shown in FIG. 1 shows how a page archived using methods and systems taught by the present invention might appear with both analog and digital information. Given a page 20 of text (or image) that needs to be stored on the permafiche media, the analog text (or image) portion 22 of the page 20 is converted into a digitally encoded matrix 24 that is present as a pattern in the footer section of the page. When the page is stored on the permafiche media, the digital code is also transferred to the permafiche substrate as a pattern. Using appropriate software decoding scheme, the page can be rapidly accessed after the image is displayed on the reader. Examples of digital patterns types that can be reproduced from an analog source are varied and well known and are thus are not described in detail here.

The Direct Write Laser (DWL) used to implement the invention is a high precision instrument using raster technology to image on various substrates like silicon, glass, film, or other photosensitive type plates. In addition to its use in the present invention, the DWL can be used to produce masks for semiconductor processing and direct writing, integrated optics, lead frames, flat panel displays, shadow masks, and any application where high precision, high-resolution images must be produced. The DWL can accommodate various laser types and write heads and allows the user access to parameter settings to optimize the use of these devices on various media.

The Direct Write Laser system used in the preferred embodiment of the invention is available in various models from companies such as Applied Materials, Heidelberg Instruments Mikrotechnik, and Micronics to name a few. The system used in the preferred embodiment includes the following features:

---

Metal cover for light and dust protection;
Heavy granite support system with air cushions for vibration isolation;
Air-cooled HeCd Laser;
Optical beam-system;
Precision stage system consisting of the following components:
   6" XY stage with linear motors;
   Special wafer/mask chuck designed for single plates; and
   Two axis interferometric positioning system.
Airgauge auto focus system; and
Complete electronic control system.

---

It is understood, of course, that the invention is not limited to the manufacturer or the type of laser system.

The DWL produces excellent quality, high resolution images using a high integrity mechanical structure, a precise position measurement system, high speed positioning control system, and beam position control. A simple schematic diagram of the system is shown in FIG. 2, however such a system is well known in the art by those who produce such equipment for use in semiconductor processing and thus is not described in detail here. In the DWL the optics remain fixed and the media is moved. With this design the optic path remains constant thereby eliminating any need to refocus or recalibrate as would be required in a system where the optical write head is moved. This simple design makes the system reliable and creates images with consistent high quality. This technology ensures position accuracy, orthogonality and quality of image. A combination of deflection and stage motion as well as multiple write heads could be also used to speed up the process of writing.

The DWL system can be used for laser pattern generating on various substrates using photoresist. Processes are described below with reference to FIG. 7 and later. The effective write grid of the DWL used is 100 nm with a minimal structure size of 2 μm using a 10 mm write head. In an active write area of 140 mm×140 mm, the write time for a two-inch square area is approximately six hours. The stage system upon which the substrate is mounted has a positional resolution of 40 nm.

Figure 3:
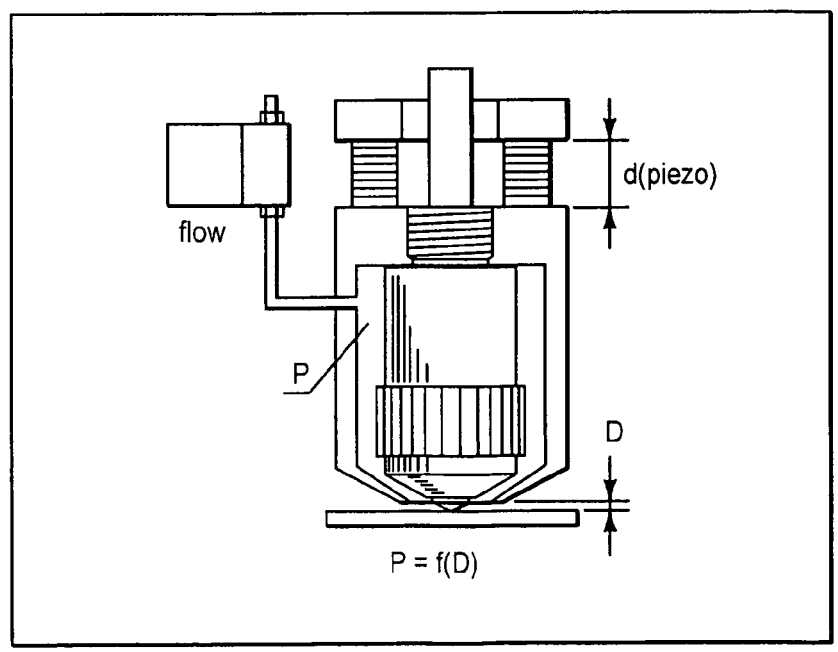
FIG. 3 is a schematic diagram of a laser write head used in the system of FIG. 2 to etch small details on the blank permafiche substrate.

The DWL offers an interchangeable write head with a selection of multiple lenses. An example of one type of write head used is shown in FIG. 3, although such heads are well known in the semiconductor mask-making industry and thus are not described in detail here. Each lens offers a different resolution and feature size to meet the needs of the application. The 10 mm write head used in the preferred embodiment has an 8 μm depth of focus, a 5 mm coarse z-range, a 70 μm fine z-range, a stability of less than 200 nm and is mounted approximately 100 μm from the substrate (shown by "D" in FIG. 3). Only one lens can be used at any one time per mount, although it is understood that multiple write head mounts can be used in parallel to speed up the write process as described further below. It typically takes less than ten minutes to change from one lens to another.

The laser system used is a special low noise HeCd-laser suitable for resist exposures. The laser used in the DWL generates coherent light having a wavelength of 442 nm, and operates with a power of 20 mW for a typical lifetime of greater than 4000 hours. The optics used in the DWL includes a lens system with highly refractive mirrors, and an acousto-optic modulator system.

The electronic components are located in an external nineteen-inch rack wired according to VDE 110 including the following components: VME-bus processor system, a 68040 processor available from Motorola, a standard 4 GB SCSI hard disk drive, OS-9 operating system, a pixel generator, a thin-Ethernet port for local area network (LAN) running TCP-IP, modulator electronics including real-time software for data decompression and exposure control, and control electronics for the state and auto focus system. Again, the specific components are not of particular importance and one skilled in the art would recognize that many other configurations are possible to operate the DWL.

Figure 4:
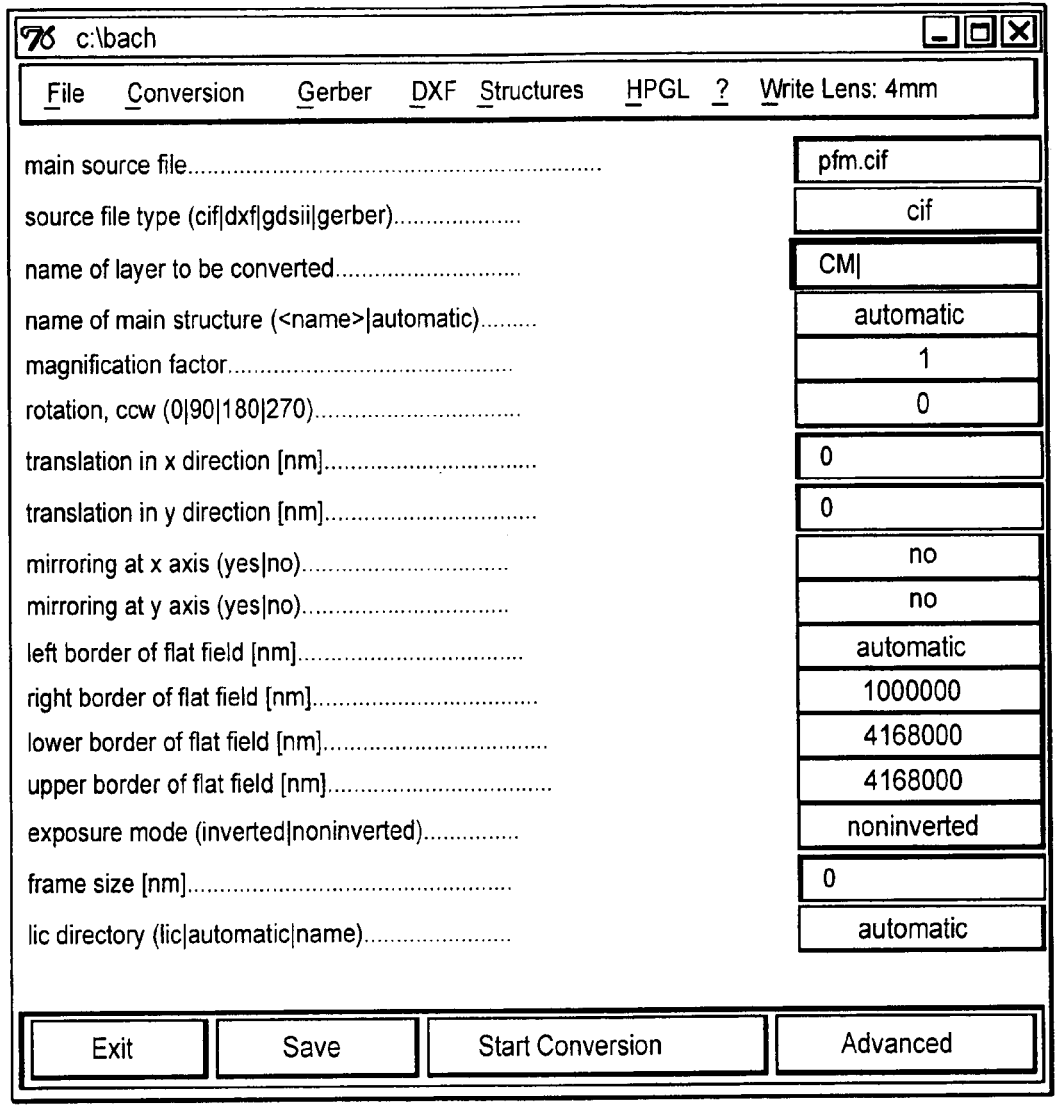
FIG. 4 is an illustration of a conversion menu window used by an operator of the system shown in FIG. 2 to specify the writing parameters used by the system to form analog (or digital) data on the blank permafiche substrate.

The control PC used in the system utilizes a 500 MHz or faster processor, 128 MB of RAM, a display device, and is operates using Windows NT/Linux or other suitable system. Data conversion software operates on a Conversion PC to convert formation data, such as the conversion menus shown in FIG. 4, into machine driver code for operating the DWL. The workflow for the system would be as follows: After generating the design with a appropriate Design software, the design will be converted on the Conversion PC into the HIMT internal format called LIC. The LIC format is a highly compressed machine format, which will be used by the DWL system for the exposure. After conversion on the Conversion PC the LIC will be send to the DWL system controller via Ethernet. The conversion software provides an easy to use and powerful graphical interface with additional functions like image reversal (positive/negative), biasing, scaling etc.

Figure 5:
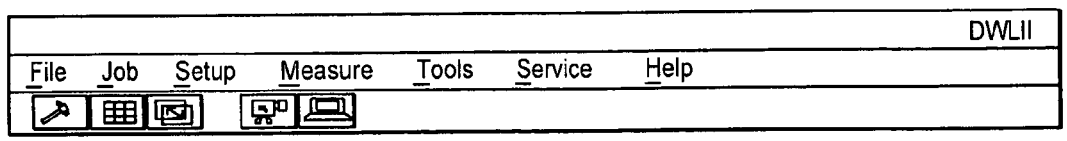
FIG. 5 is an illustration of an operator menu used to select various function of the Operator PC.

The Operator PC runs under Windows NT and includes a system control menu shown in FIG. 5.

There are several options that can be used with the DWL system including a metrology and alignment system, a front to back side alignment system, additional write heads, a larger stage for increased active write area, and an environment chamber including flowbox.

The metrology and alignment system is used for multi-layer exposures and metrology measurements and includes the following components: Image Processing (IPC), two camera system, white light illumination and image software (FIPS). The alignment accuracy with a 4 mm lens is on the order of 250 nm. Using front- to back-side alignment with a CCD camera system for three to six inch wafers, the alignment accuracy is on the order of 2 μm.

The system has an exchangeable write head system. The operator can easily exchange each write head within 10 minutes. Exchanging the write head changes the system's performance specifications such as throughput, resolution, etc. The following are examples of different write heads that can be used:

| | 4 mm Write Head | 20 mm Write Head | 40 mm Write Head |
| --- | --- | --- | --- |
| Focal Length | 4 mm | 20 mm | 40 mm |
| Minimal Structure Size | 0.8 μm | 4 μm | 8 μm |
| Write Time for 2" area | 20 hours | 4 hours | 2 hours |

Another option is to increase the size of the stage upon which the substrate is mounted from six inches to eight inches, thereby increasing the active write area to 170 mm by 185 mm.

Finally, the system can be fitted with a flowbox, which provides the environment of the system with a laminar airflow, a constant temperature and clean air. The airflow is adjustable. The temperature inside the environment chamber is typically 2° higher than the rated value of the environment outside of the chamber. The airflow is adjustable between flow rates of 0.3-0.5 m/s, with a temperature stability of ±1° C., at a class 10 air quality.

Figure 7:
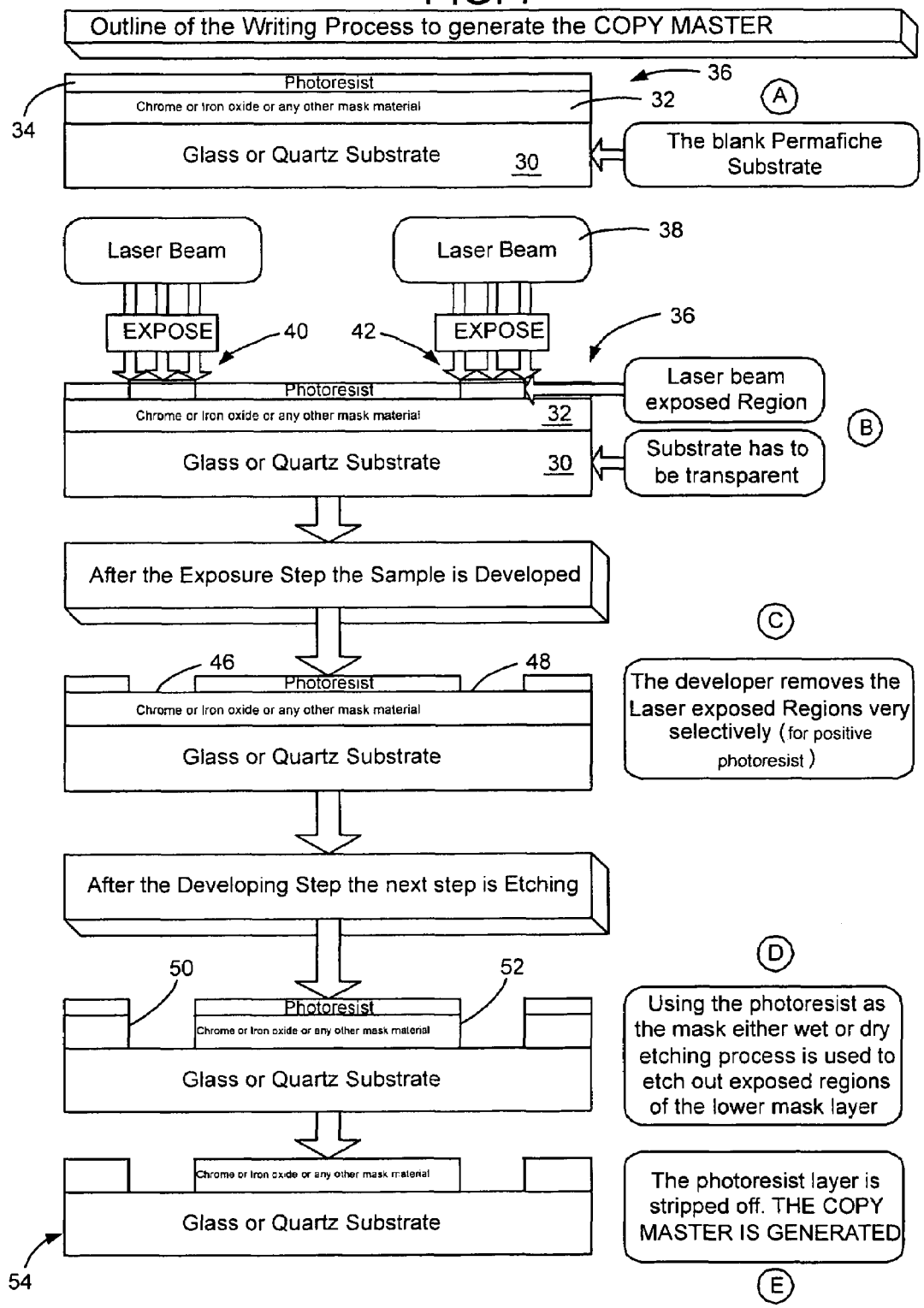
FIG. 7 is a flow diagram illustrating the process for generating a "copy master."
Figure 8:
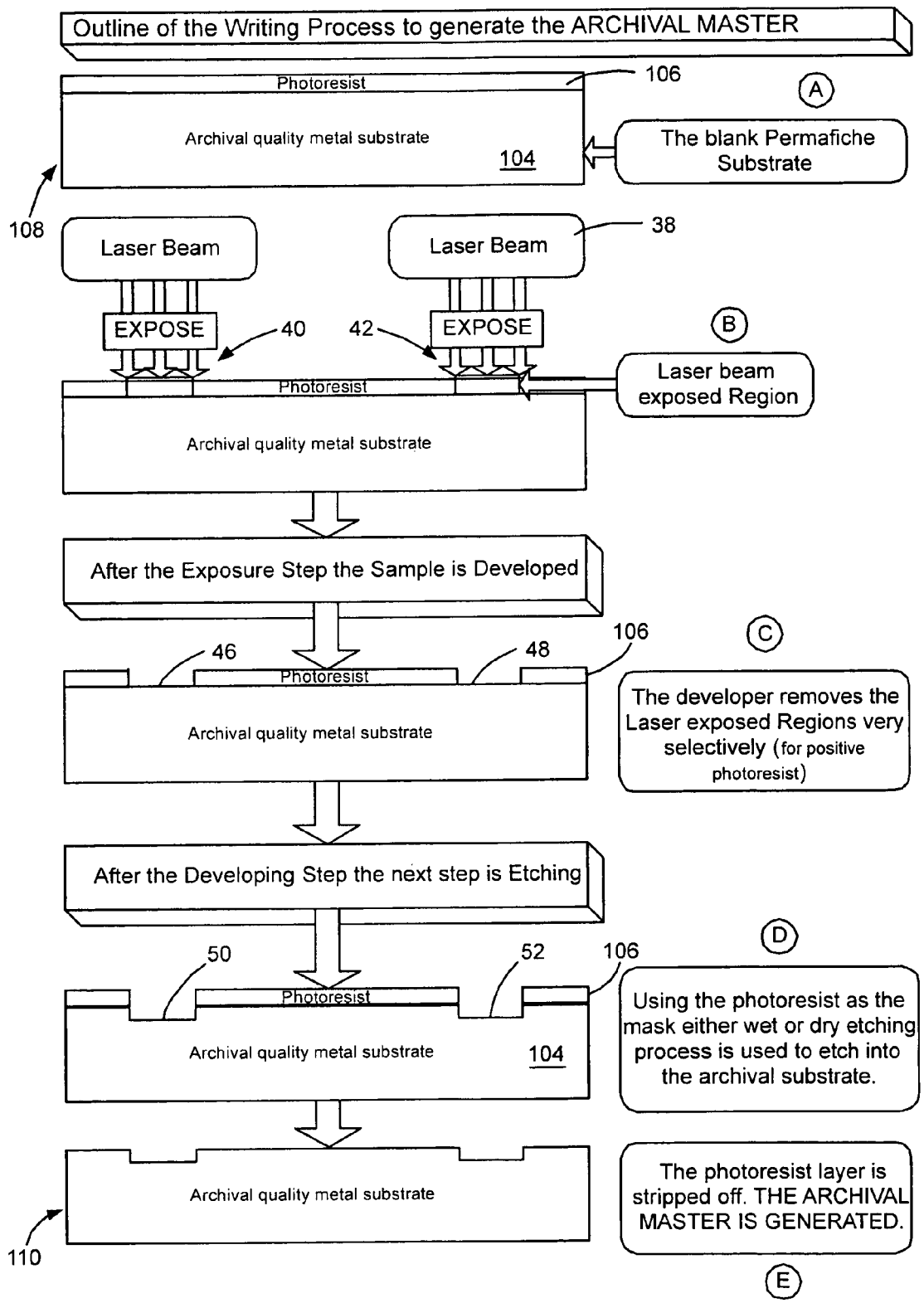
FIG. 8 is a flow diagram illustrating the process for generating an archival master.

We will now proceed with a description of the preferred processes for manufacturing two types of archival substrates, termed a "copy master" substrate (sample process of manufacture shown in FIG. 7) and an "archival master" substrate (sample process of manufacture shown in FIG. 8).

Formation of the Copy Master

The copy master substrate incorporates a base substrate 30, hard metal (hard mask) 32, and photoresist layer 34 forming a blank permafiche substrate 36. The base substrate 30 is a transparent material, preferably formed of glass, quartz or sapphire having a thermal conductivity very similar to the metal mask placed on top of the base substrate in a later process step. It is also contemplated that the base substrate is a plastic or polymer exhibiting transparent optical properties. The base transparent substrate has an approximate thickness of between about 0.1-2 mm, however this thickness is not a very critical parameter for the archival methods described.

In forming the blank permafiche substrate 36 shown in step A, a hard mask 32 is deposited on the base substrate as by sputtering, evaporation, etc. to form a low stress layer "Hard Mask". The hard mask 32 is preferably chrome or iron oxide but can also be made from other metals, metal oxides, oxides, nitrides, and carbides as listed below:

Metals: Chrome, Tantalum, Gold, Platinum, Titanium, Nickel, Iron, Tungsten etc

Metal Oxides: Iron oxide, chromium oxide, Tungsten oxide, Titanium oxide etc. The main advantage of using metal oxide or oxides over metals is one can obtain much finer features and smoother wall profiles, mainly because oxides are amorphous materials and the feature/profiles are not limited by the grain size of the material.

Oxides: Silicon dioxide etc

Nitrides: Silicon Nitride, Tungsten nitride, Tantalum nitride etc. The nitrides also has similar advantages as oxides, and because of its high density (very close to its pure metal form) one can use nitride to build X-ray masks.

Others: Diamond like carbon (DLC), Diamond films etc.

The typical thickness of the hard mask varies from 50 nanometers to a few microns.

A photoresist layer 34 is then deposited on the hard mask layer, as by spin or spray coating, to form a thin uniform layer of photosensitive polymer on top of the hard mask. The polymer is the top most layer on which the data is first written using the DWL system according to the invention and as shown in FIG. 7. A mono-layer adhesion layer could be used prior to spin coating or spray coating the photoresist layer over the hard mask layer. The adhesion layer helps in providing a good bonding surface for the photoresist layer to the hard mask layer. Typical adhesion material is HMDS, although it is understood that others knowledgeable in the art would recognize other materials that would work. Typical resist thickness is between 400-550 nanometers, but one can use thinner or thicker photoresist layers anywhere from a few nanometers to a few microns.

Typical photoresists used are both positive types and negative types. The preferred positive types are type AZ71518 available from AZ Electronic Materials of Somerville, N.J., and the Shipley 1800 series available from Shipley Company of Marlborough, Mass. It is understood that other AZ series resists, and other positive resists from Shipley can be used without departing from the teachings of the invention. Available negative photoresist includes SU8, developed by IBM and supplied by Silicon Resources of Chandler, Ariz. with other negative resists also available from AZ Electronic Materials and Shipley. In our current application, the preferred photoresist is positive, photoresist AZ1518 and Shipley 1800 series, and the thickness of the resist layer is 520 nanometers.

Referring still to FIG. 1, shown are the method steps for generating a copy master. In step 1, copy master substrate 36 (incorporating the transparent base substrate, hard mask layer, and photoresist layer described above) is mounted to the stage of the DWL system. The photosensitive layer (top layer) is then exposed in step B by the laser 38 only at predefined pixel locations 40, 42 that describe the pattern of the data being written. This pattern is determined according to the LIC format (driving the DWL Control PC) that is generated by converting the parameters within the conversion menu (FIG. 4) using the data conversion software operating on the Conversion PC.

The process for using ion beam or e-beam energy sources is identical to the one that was provided for the laser writing process. The only difference is in the beam that is used to expose the photoresist. Here we are providing the typical parameters that we used to expose the photoresist using electron and ion beam:

Electron beam writer:
  Accelerating voltage: 2-30 kV (ideal: 30 kV)
  Beam current: 5 picoamps to 10 nanoamps (ideal: 80 picoamps)
  System Manufacturers: JEOL, Applied materials, Leica, Hitachi Ion beam writer:
  Accelerating voltage: 5-120 kV (ideal: 30 kV)
  Beam current: 4 picoamps to 20 nanoamps (ideal: 10 picoamps)
  System Manufacturer: FEI, LEO, Hitachi, Seiko and Schlumberger After the laser exposure step, the copy master substrate 36 is exposed to a developer in step C to remove either the exposed or unexposed regions 42, 44 depending upon whether the developer is positive or negative. The developer could be either sprayed on the substrate or the substrate could be dipped in a container filled with the developer solution.

Case 1: If the photoresist layer 34 is positive in nature as shown in FIG. 7, the laser exposed pixels or regions 42, 44 will be removed by the developer to reveal exposed portions 46, 48.

Case 2: If the photoresist layer 34 is negative in nature (not shown in FIG. 7), the laser exposed pixels or regions 42, 44 will remain intact and the rest of the unexposed area will be removed by the developer.

The developed copy master substrate 36 is next subjected to a low temperature bake step to harden the photoresist layer. Typical heating parameters are 150° C. for 1-2 minutes. Using the photoresist as the soft mask the next step is to transfer the pattern or information from the soft mask to the hard mask, thereby forming three-dimensional features such as cavities 50, 52. Two transfer techniques could be used with the final results shown in step D: (1) use of wet chemistry, and (2) dry etching for very precise control of the etch rate and feature wall profile. These techniques are described in further detail below:

Etching Technique #1:
  Currently we are using Chrome as our hard mask material and here is the procedure we are following to transfer the pattern generated on the photoresist to the chrome layer (hard mask layer). The procedure described below uses a wet chemical etching process:

Formulation for Cr-Mask Etching

| Cerium ammonium nitrate $Ce(NH_4)_2$—$(NO_3)_6$ | 200 g |
|---|---|
| Acetic acid (glacial) $CH_3COOH$ 98% | 35 ml |
| Adding De-ionized Water | — |
| Total | 1000 ml |

First dissolve the acid in 700 ml of DI water. Then add the Ceric ammonium nitrate and stir for about ten minutes until the solution is almost clear. Now add the remaining water to make 1000 ml. If the water has not been acidic before the adding the ceric ammonium nitrate then a precipitate is formed which cannot be removed by filtering. The etchant should be filtered before use. Any drying of blanks during processing should be avoided. Rinse at least 2 minutes in running DI water or fifty seconds DI water spray after etching.

Etching Technique #2: The above process involves wet chemistry and due to isotropic etching nature of wet chemistry very sharp vertical wall profile may not be obtained. But for our application, wet chemistry is an ideal solution. It is cheap and fast and does not require any additional expensive equipment. But one can also use dry etching process to obtain near vertical wall profile and much tighter control on the process and cleanliness. The typical dry etch chemistry as follows for etching of chrome: (The dry etching process is a well known technique and is not being explained here)

| Power: | 150 W |
|---|---|
| Pressure: | 150 m Torr |
| $SF_6$: | 25 sccm |
| $O_2$: | 10 sccm |
| $CHF_3$: | 2 sccm |
| Time: | 90 minutes |

After the pattern or information is transferred from the soft mask to the hard mask, the soft mask (photoresist layer) is stripped off in step E either using wet chemistry or dry chemistry. Typical wet chemical stripping agents are ketone based while for dry chemistry they are oxidizing gases. Thereafter the copy master 54 is ready. One can then generate multiple distribution copies from the copy master (FIGS. 9-11) or generate the final archival master for long-term storage from the copy master (FIG. 12).

Formation of the Distribution Copies

Figure 9:
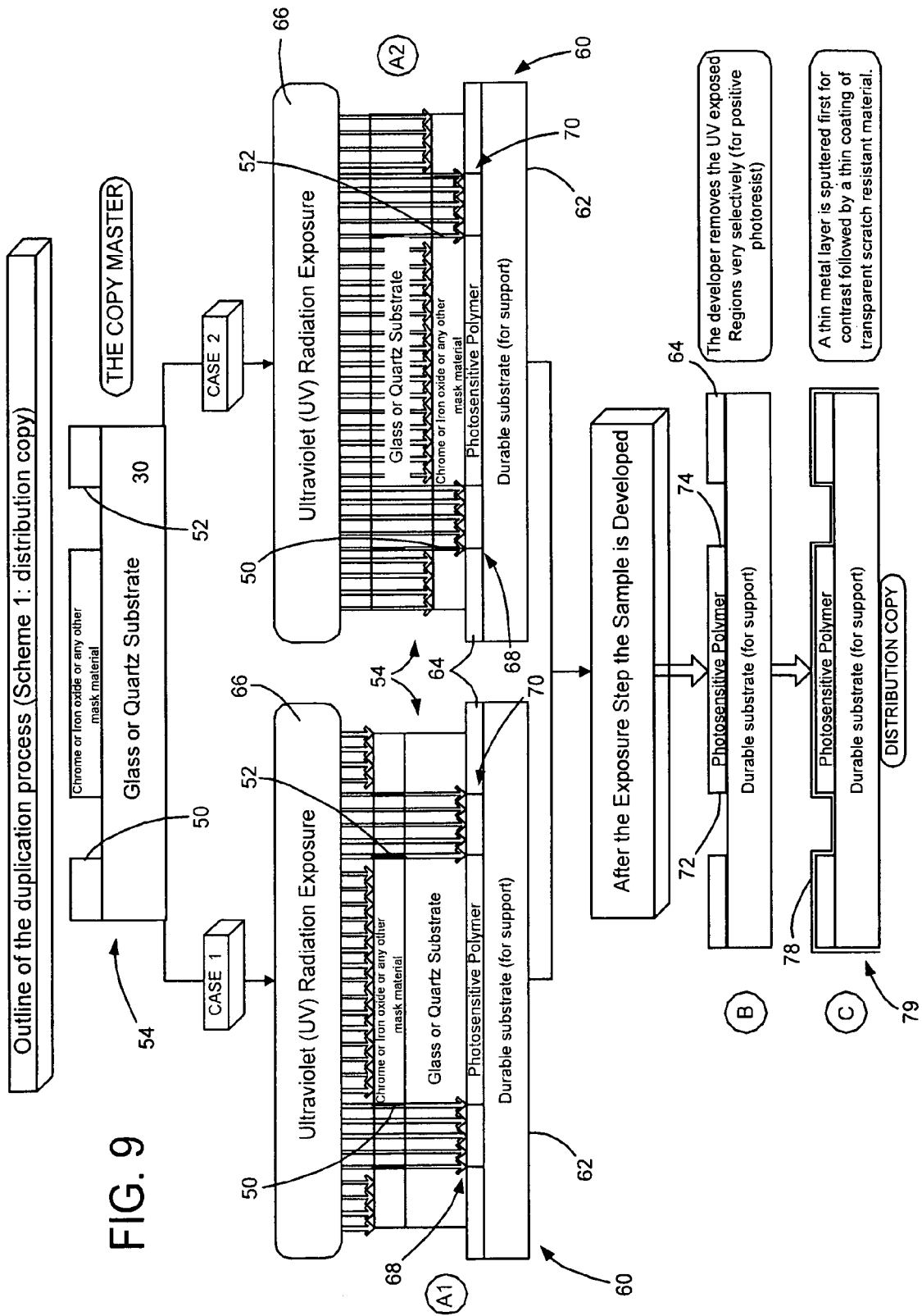
FIG. 9 is a flow diagram illustrating a preferred process for generating a "distribution copy" from a copy master.
Figure 10:
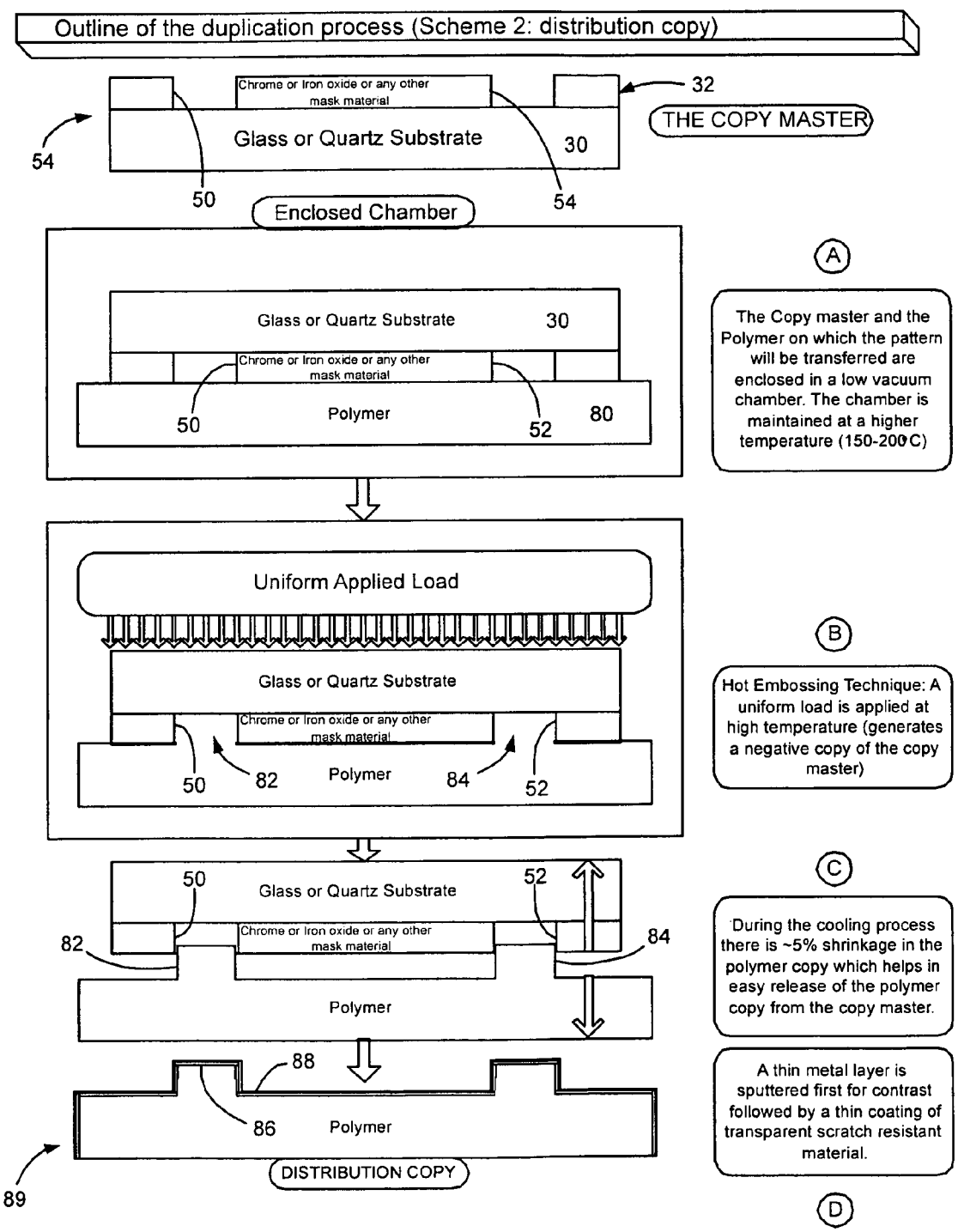
FIG. 10 is a flow diagram illustrating an alternate process for generating a copy from a copy master.
Figure 11:
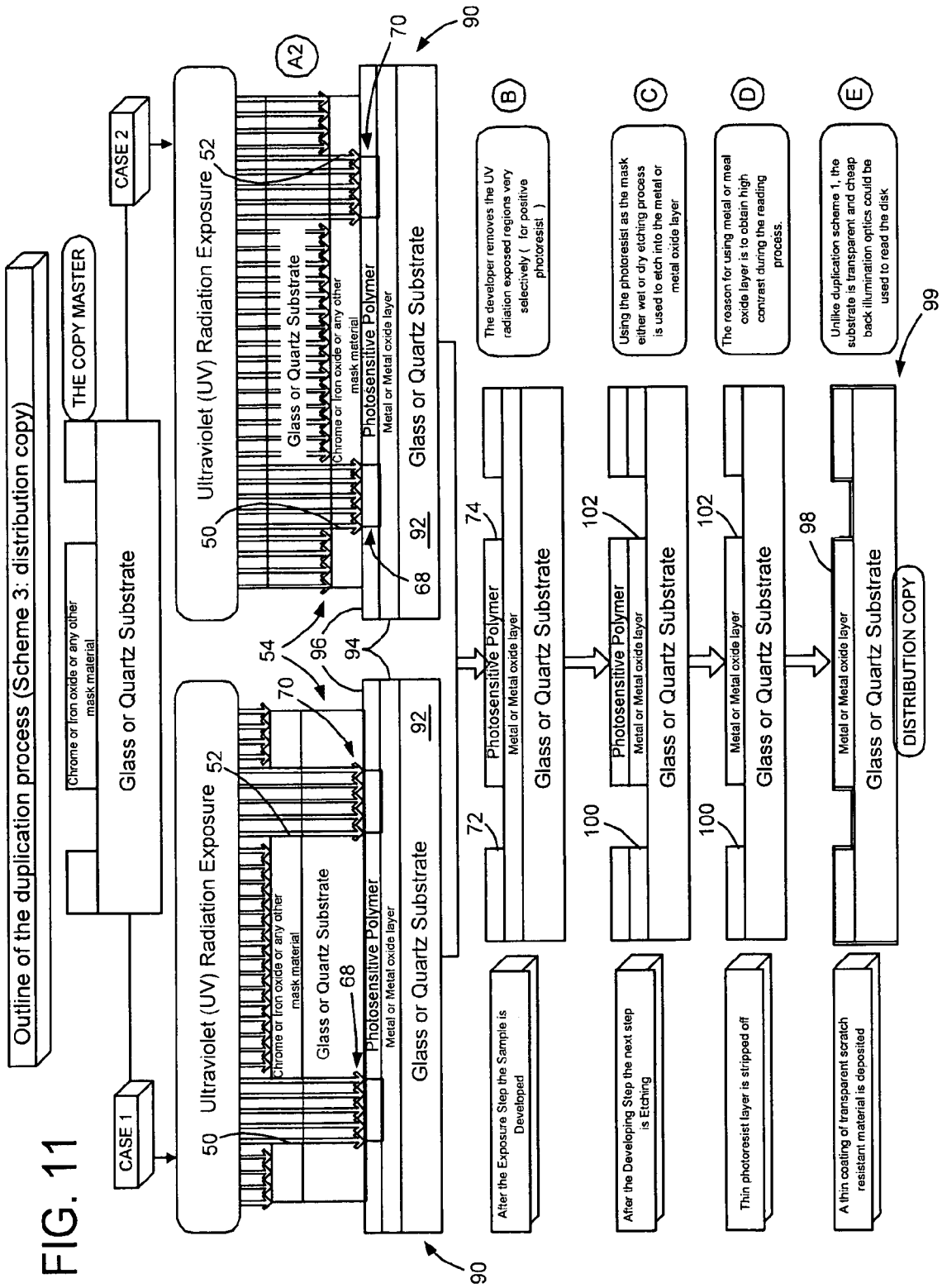
FIG. 11 is a flow diagram illustrating a second alternate process for generating a copy from a copy master.
Figure 12:
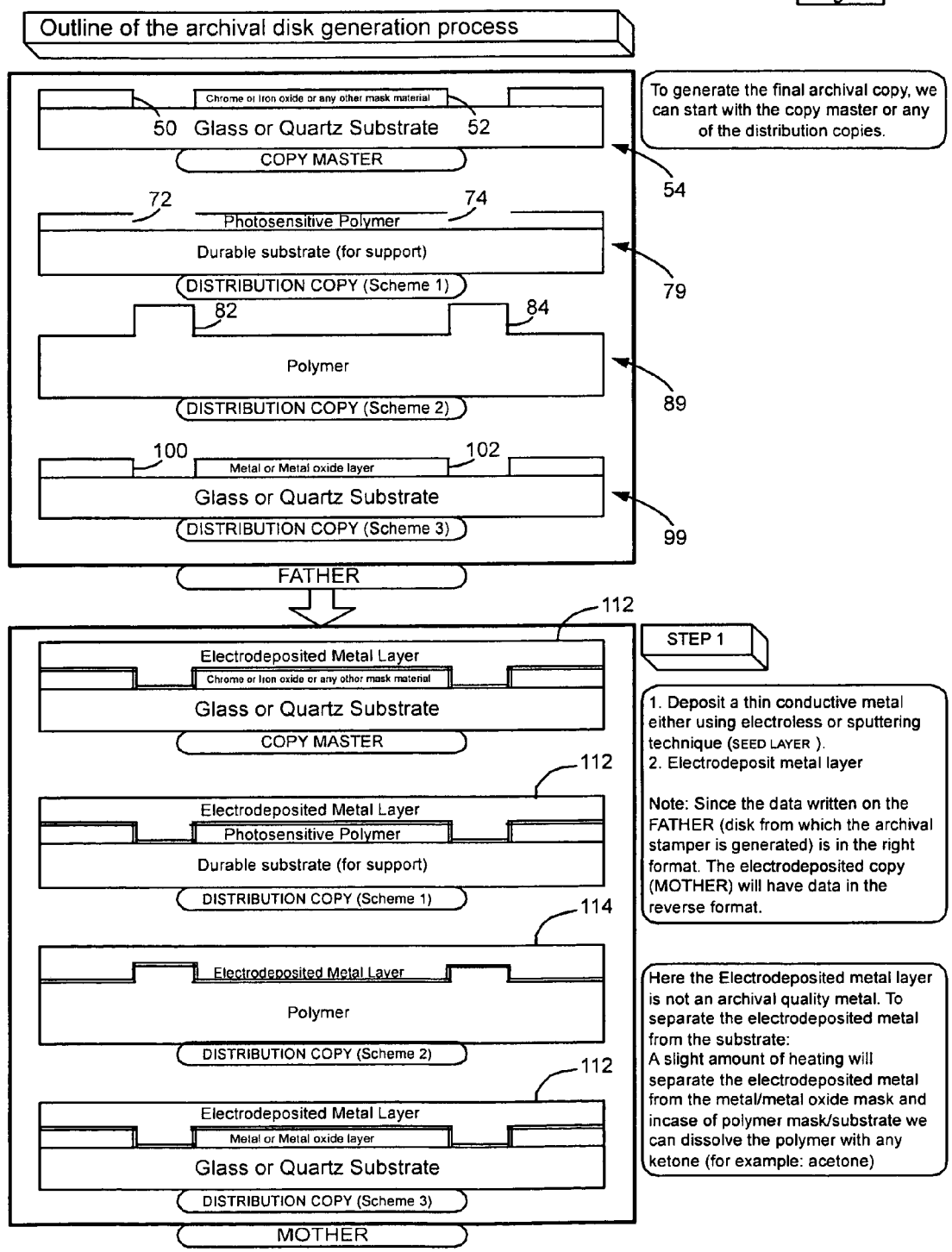
FIG. 12 is a flow diagram illustrating a preferred process for generating an archival disk from a copy master.

Distribution Copies are relatively inexpensive permafiche materials formed using the copy master 54 as a template, as shown in FIGS. 9-11. Three schemes for forming the distribution copies are detailed below:

Scheme 1 (FIG. 9)

Under a first scheme, shown in FIG. 9, the "copy master" 54 is aligned and placed in contact with the distribution substrate 60 as shown in FIG. 9, Case 1. Alternately, the copy master can be aligned and placed in contact with the distribution substrate 60 as shown in FIG. 9, Case 2. The substrates 62 for creation of distribution copies consist of any robust/durable material such as metal or polymer with a thin coating of photosensitive polymer. The polymer 64 type chosen is appropriate for exposure under the wavelength range of the UV source, having an approximate thickness of 400 nm. The choice of the metal or polymer for the substrate is based on the thermal expansion coefficient, which should be similar to the thin coating of photosensitive polymer coating (photoresist) and also should provide good adhesion property to the photoresist. The preferred photoresist polymer used is polymethyl methacrylate, also known as PMMA, although it is understood that other polymers can be used.

In steps A1 or A2, a broad UV source or a UV scanner 66 is used to expose the photosensitive polymer 64 on the distribution substrate 62. The copy master 54, acting as the contact mask, serves the purpose of allowing exposure of the photosensitive polymer only in the regions 68, 70 directly beneath the open regions 50, 52 of the chrome pattern.

After the exposure step, the distribution substrate 62 is exposed to the appropriate developer and in step B the UV exposed regions 68, 70 of the photosensitive polymer 64 are dissolved out (as in the case when a positive photoresist is used as the photosensitive polymer). Using a negative photoresist will of course result in the unexposed regions being dissolved out. The resulting structure includes exposed regions 72, 74 through the photosensitive polymer 64.

Finally, a thin layer of metal such as Ti, Ni, Cr or other metal is sputtered over the patterned distribution substrate 62 in order to form a contrast enhancing layer 76 and provide a high contrast of features for viewing. Following that a scratch resistant material such as diamond-like-carbon (DLC), aluminum oxide or silicon dioxide is sputtered over the metal layer to form scratch resistant layer 78 of the final distribution copy 79.

Scheme 2 (FIG. 10)

Under a second scheme, shown in FIG. 10, the copy master 54 is aligned and placed over a polymer material 80. These are then enclosed in step A in a low vacuum chamber that is maintained at a temperature range higher than the glass transition temperature range of the polymer (180-200° C.), whereby the distribution substrate 80 consists of a durable temperature sensitive polymer of appropriate thickness to ensure ease of handling. An embossing technique is used where a uniform load is applied on the copy master 54 in contact with the polymer 80 in step B. This causes the transfer of the pattern of the copy master 54 onto the polymer 80 whereby the polymer now is embossed with a pattern that is an exact negative of the copy master. In the example shown, for instance, voids such as open regions 50, 52 in the patterned hard mask layer 32 of the copy master 54 form complementary peaks 82, 84 in the polymer.

To disengage the copy master 54 from the now-embossed distribution copy polymer substrate 80, a heating process is used to take advantage of the thermal expansion (and contraction) properties of the materials used. After completion of the high temperature hot embossing technique, the copy master 54 with attached patterned polymer 80 are withdrawn from the low vacuum chamber and cooled to room temperature in step C. During the cooling process an approximate 5% shrinkage of the polymer 80 results which is instrumental in releasing the copy master 54 from the polymer.

Once removed, a thin layer 86 of metal such as Ti, Ni, Cr or other metal is sputtered over the patterned distribution substrate in step D in order to provide high contrast of features for viewing. Following that a scratch resistant material 88 such as diamond-like-carbon (DLC), aluminum oxide or silicon dioxide is sputtered over the metal layer to form the final distribution copy 89.

The big advantage of this method lies in its flexibility, the low internal stresses and high structural replication accuracy due to the small thermal cycle (approximately 40° C.), so that structural replications in the nanometer-range are possible.

Scheme 3 (FIG. 11)

The methods in FIG. 11 are similar to those in FIG. 9, the difference being the type of distribution substrate 90. The distribution substrate is transparent and consists of a glass or quartz substrate 92 with a thin layer of metal or metal oxide 94 over which is formed another thin layer of photosensitive polymer 96. The copy master is aligned and placed over the distribution substrate as illustrated in FIG. 11 (Case 1 or Case 2). Exposure steps A1 or A2 and developing step B are similar to that described in FIG. 9. The is also an etching of the hard mask 94 to form voids 100, 102 in step C and photosensitive polymer layer 96 removal in step D similar to that used in forming the copy master. This is then followed in step E by application of a scratch resistant coating 98 over the patterned metal or metal oxide layer over the glass or quartz substrate. Unlike the duplication process described in FIG. 9, the FIG. 11 process describes a duplication process for creation of a transparent distribution copy. The distribution copy 99 formed using FIG. 11 would thus result in a disk where low-cost back illumination optics, such as used in the conventional microfiche industry, can be used for reading the information on the disk.

Scheme 4

A low viscosity vinyl polysiloxane impression material is used to produce distribution copies from archival master or from copy master. Features as small as 1-2 microns have been replicated using the impression material. The key features of the vinyl polysiloxane material are as follows:

Tasteless and odorless. (Dentists use similar polymer material for dental impression)
Electroplate able
Does not absorb moisture
Can replicate accurately features as small as 1-2 microns
It does not discolor
No shrinkage after it is cured
Long shelf life 2 years
Take about 2-4 minutes to generate a replicate from the master disk manually
Does not require any heating
Does not require release agent The vinyl polysiloxane is a two-part mixture consisting of a base and an accelerator. A predetermined amount is mixed either manually or using an automated syringe type dispensing system. The master or copy master disk from which the distribution copies are to be generated is cleaned with alcohol and blown-dry it with nitrogen gas. The low viscosity impression material is then poured on the master disk or copy master. Using a flat glass plate, one then applies a uniform pressure to primarily flatten the back surface of the distribution copy. The impression material is then allowed to set for approximately 2 minutes during which time the impression material shrinks by ~0.05% which helps in easy disengagement of the impression material from the master or copy master disk. In this process there is no need for release agent, there is no residue, nor there is any reaction with the metal in the master or copy master disk. Since the polymer is electroplatable, distribution metal copies may be generated from the polymer copy.

Formation of the Archival Master

The "archival master" is a disk formed of a base archival quality substrate on which pits are formed for storing information in analog form. The archival master can be formed directly from the DWL process shown in FIG. 8, or by using a copy master or distribution copies as disclosed in FIG. 12.

Figure 6:
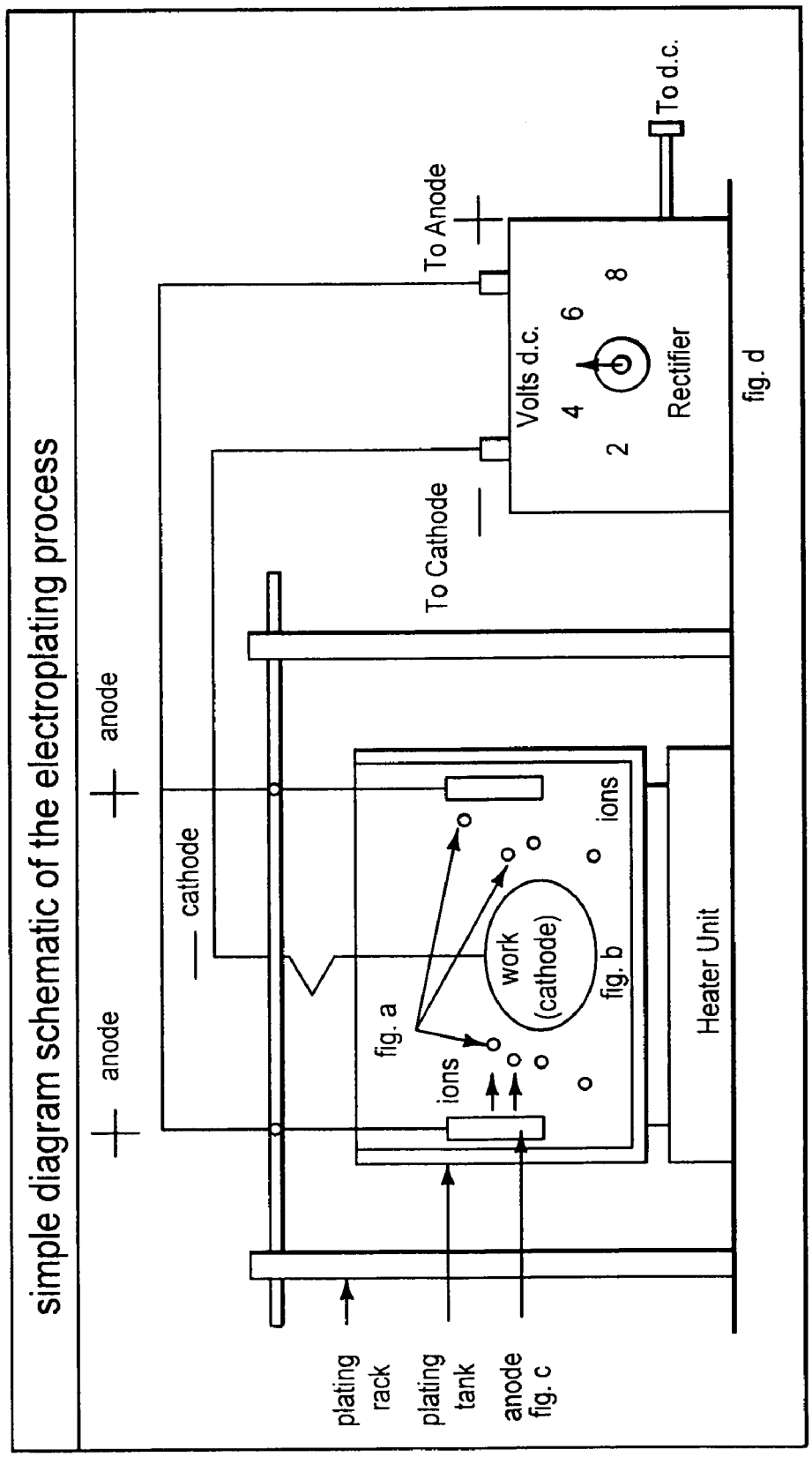
FIG. 6 is a schematic illustration of the electroplating process used in the electrodeposition intermediate step for forming an "archival master."

The preferred archival metal substrate 104 is generally pure nickel, but various other durable materials could be used including but not limited to diamond, sapphire, or pure nickel embedded with fine diamond powder. The introductions of angstrom size diamond particles in the plating bath during electroplating (FIG. 6) will help reduce stresses during the plating process and also increase wear and thermal resistance properties. Currently nickel has been identified as the material of choice for the archival substrate but it is understood that more experiments will be conducted in the future to compare nickel with a few other metal alloys and even diamond substrates.

A photoresist layer 106 is then deposited on the archival metal substrate layer, as by spin or spray coating, to form a thin uniform layer of photosensitive polymer on top of the substrate. The polymer is the top most layer on which the data is first written using the DWL system according to the invention and as shown in FIG. 8. A mono-layer adhesion layer could be used prior to spin coating or spray coating the photoresist layer over the archival metal substrate. The adhesion layer helps in providing a good bonding surface for the photoresist layer to the substrate. Typical adhesion material is HMDS, although it is understood that others knowledgeable in the art would recognize other materials that would work. Typical resist thickness is between 400-550 nanometers, but one can use thinner or thicker photoresist layers anywhere from few nanometers to few microns. The preferred photoresist used is similar to the types detailed in the previous section above for formation of the copy master.

Referring still to FIG. 8, shown are the method steps for generating an archival master. In step A, the archival master substrate 108 (incorporating the archival metal substrate 104 and photoresist layer 106 described above) is mounted to the stage of the DWL system. The photosensitive layer (top layer) 106 is then exposed by the laser 38 only at predefined pixel locations 40, 42 that describe the pattern of the data being written. This pattern is determined according to the LIC format (driving the DWL Control PC) that is generated by converting the parameters within the conversion menu (FIG. 4) using the data conversion software operating on the Conversion PC. After the laser exposure step B, the archival master substrate 108 is exposed to a developer in step C. The developer could be either sprayed on the substrate or the substrate could be dipped in a container filled with the developer solution.

Case 1: If the photoresist layer 106 is positive in nature as shown in FIG. 8, the laser exposed pixels or regions 42, 44 will be removed by the developer to reveal exposed portions 46, 48.

Case 2: If the photoresist layer 106 is negative in nature (not shown in FIG. 8), the laser exposed pixels or regions 42, 44 will remain intact and the rest of the unexposed area will be removed by the developer.

The developed copy master substrate 108 is next subjected to a low temperature bake step to harden the photoresist layer. Typical heating parameters are 150° C. for 1-2 minutes. Using the photoresist 106 as the soft mask, the next step is to transfer the pattern or information from the soft mask to the archival metal substrate in step D. The exposed portions 46, 48 then result in etched portions 50, 52. Three techniques could be used: (1) use of wet chemistry, (2) dry etching for very precise control of the etch rate and feature wall profile, and (3) reverse electroplating. These techniques are described in further detail below:

Etching Technique #1: With nickel as the preferred archival quality material, the first technique followed to transfer the pattern generated on the photoresist to the nickel layer (archival quality metal substrate) uses a wet chemical etching process:

The standard formulation for the nickel etch uses a mixture of $H_2SO_4$ (Sulfuric acid) and $H_2O_2$ (Hydrogen Peroxide) at a temperature of 140° Fahrenheit.

Etching Technique #2: The above process involves wet chemistry and due to isotropic etching nature of wet chemistry very sharp vertical wall profile may not be obtained. But for our application, wet chemistry is an ideal solution. It is cheap and fast and does not require any additional expensive equipment. But one can also use dry etching process to obtain near vertical wall profile and much tighter control on the process and cleanliness. The typical dry etch chemistry is as follows for etching of nickel:

| | |
|---|---|
| Power: | 150 W |
| Pressure: | 150 m Torr |
| $SF_6$: | 25 sccm |
| $O_2$: | 10 sccm |
| $CHF_3$: | 2 sccm |
| Time: | 90 minutes |

Etching Technique #3: Reverse electroplating involves a process where the electroplating set up has a reverse bias applied to the sample (the archival master 108) i.e. the sample is made into the positively charged anode. [The "electroplating" or "electrodeposition" basics have been described further below.] The negatively charged cathode that will complete the D.C. circuit could be composed of any conductive metal. The archival master is submerged in the electroplating bath with the patterned soft mask facing downwards. The cathodes may be placed at the sides or bottom of the tank. During reverse electroplating, regions of the patterned archival master with the Nickel exposed will get etched out by the movement of Nickel into the plating berth. The depth to which the exposed Nickel gets etched is controlled by the bias applied, the plating bath chemistry, and the time. The plating bath chemistry has been detailed further below in the section describing electrodeposition.

After the pattern or information is transferred from the soft mask to the archival metal substrate, the soft mask (photoresist layer 106) is stripped off in step E either using wet chemistry or dry chemistry. Typical wet chemical stripping agents are ketone based while for dry chemistry they are oxidizing gases. Thereafter the archival master 110 is ready.

FIG. 12 illustrates the method for forming an archival master using an electroplated negative archival stamper as an intermediate step. To generate the archival master we can start with either the copy master 54 or distribution copies 79, 89, or 99 generated by any one of the three schemes described previously in the section above. A conductive metal layer is first deposited over the patterned copy master or distribution copy using sputtering, evaporation or electro less technique. This forms the "seed" layer (conductive layer).

Using an electro-deposition technique, an appropriate thickness of metal 112 is deposited over the seed layer. The type of metal chosen for the fabrication of the "mother" (also known as the "archival stamper") should be different than the metal chosen for generation of the archival master in order to take advantage of a difference in thermal expansion coefficients of two different metals. In a subsequent step, one then separates the "mother" from the copy master 54 or distribution copy 99 generated by FIG. 11 using heating, thereby taking advantage of the difference in thermal expansion coefficients. One can separate the "mother" from the distribution copy generated by methods shown in FIGS. 9 and 10 by using a ketone based solvent. Note that the "mother" created by electrodeposition 114 over the distribution copy 89 generated by FIG. 10 will have reverse pattern to the "mother" 112 generated by the copy master and distribution copy 79, 99 generated by FIGS. 9 and 11.

Figure 13:
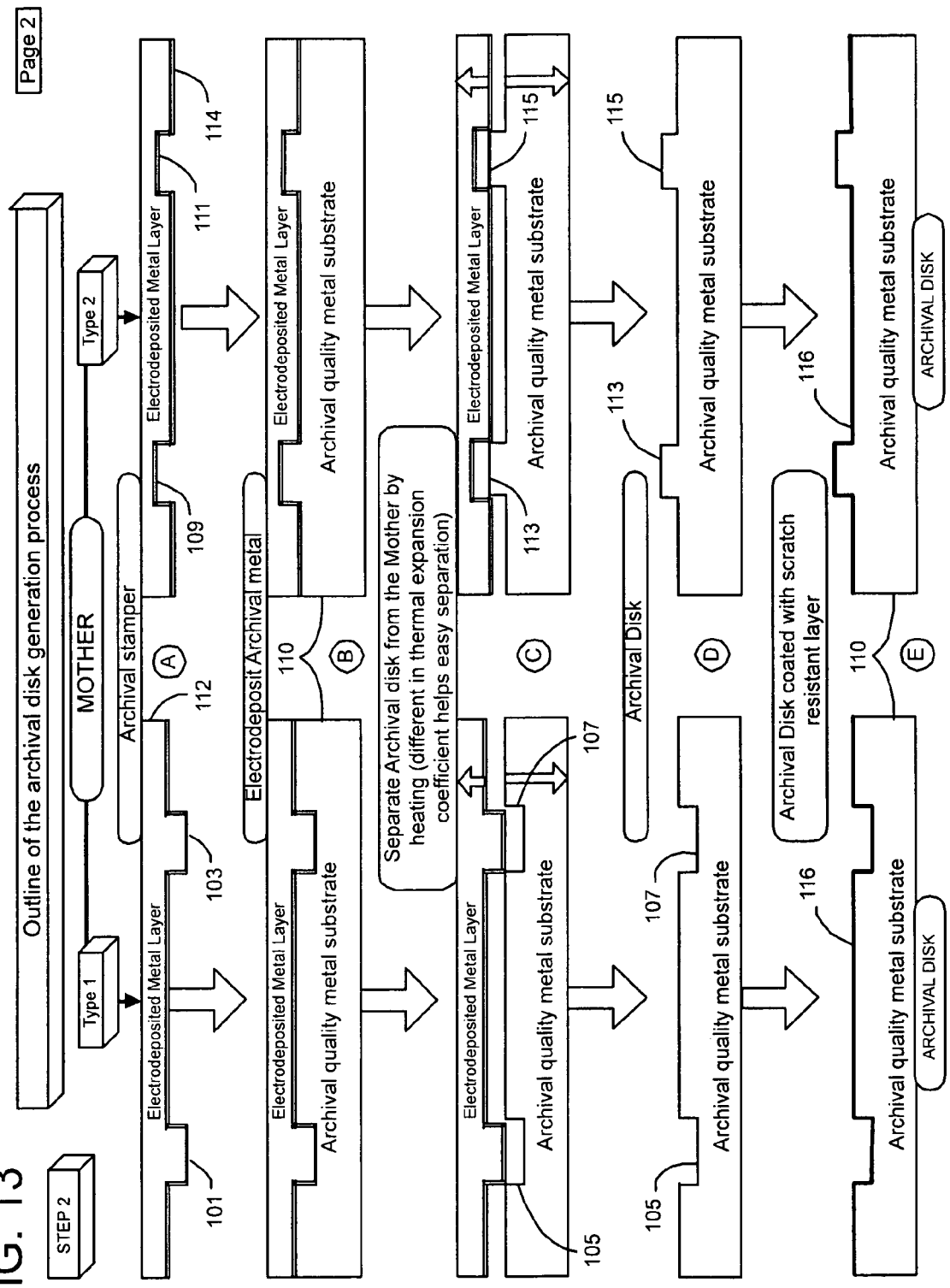
FIG. 13 is a flow diagram schematic illustrating a preferred process for generating an archival master from an archival stamper.

The "mother", also called the archival stamper, is now used in FIG. 13, step A for generation of the archival master. In step B of FIG. 13, the metal forming the archival metal substrate 110 is electrodeposited on the "mother" (either metal pattern 112 or negative metal pattern 114). The archival master 110 is then separated in step C from the archival stamper 112 or 114 by heating, thereby taking advantage of the differences in thermal expansion coefficients of the two metals. The peaks of the archival stamper, such as peaks 101, 103 in metal pattern 112, result in valleys or pits in the electrodeposited archival master 110, such as corresponding pits 105, 107. Likewise, the pits of the archival stamper, such as pits 109, 111 in metal pattern 114, result in peaks formed in the electrodeposited archival master 110, such as peaks 113, 115. The raw archival master 110 in step D (a negative of the "mother") can then be coated with a scratch resistant coating 116 if needed in step E.

Electrodeposition

Electrodeposition can be defined as the deposit of a very thin layer of metal "electrolytically" to a base metal or other substrate materials on which a metal "seed layer" has been deposited by sputtering, evaporation or electro-less technique. Electrodeposition is done in a liquid solution called an "electrolyte" (fig. A in FIG. 6), also known as a "plating bath". The plating bath is a specially designed chemical bath that has the desired metal (Brass, Cadmium, Copper, Gold, Silver, Tin, Zinc, Chromium, Nickel-Cobalt or other metals) dissolved as microscopic particles (positive charged ions) suspended in solution. The plating bath solution serves as a conductive medium and utilizes a low D.C. voltage (direct current). The object that is to be plated is submerged into the plating bath and a low voltage D.C. current is applied to the bath. Generally located at the center of the plating bath, the object that is to be plated acts as a negatively charged "cathode" (fig. B in FIG. 6). The positively charged "anodes" (fig. C in FIG. 6) that will complete the D.C. circuit are carefully positioned at the edges of the plating tank. A power source known as a "rectifier" (fig. D in FIG. 6) is used to convert A.C. power to a carefully regulated low voltage D.C. current.

The resulting circuit channels the electrons into a path from the rectifier to the cathode (object being plated), through the plating bath to the anode (positively charged) and back to the rectifier. Since electrical current flows from positive to negative, the positively charged ions at the anodes flow through the plating bath's metal electrolyte toward the negatively charged cathode. This movement causes the metal ions in the bath to migrate toward extra electrons located at the cathode's surface outer layer. By means of electrolysis, the metal ions are taken out of solution and are deposited as a thin layer onto the surface of the object.

This process is called electrodeposition. Theoretically, the thickness of the electrodeposited layer deposited on the object is determined by the time of plating, and the amount of available metal ions in the bath relative to current density. The longer the object remains in the D.C. activated plating bath, the thicker the electrodeposited layer will become. The inherent shape and contour of the object can affect the thickness of the plated layer. Metal objects with sharp corners and edges will tend to have thicker plated deposits on the outside corners and thinner deposits in the recessed areas. This occurs because the D.C. current flows more densely around the outer edges of an object than the less accessible recessed areas. With rare exception, electroplating processes will not conceal preexisting surface blemishes such as scratches, dents, or pit. In fact, the plating process has a tendency to make most surface imperfections even more noticeable. It is therefore necessary to remove any undesirable surface marks prior to the electrodeposition process.

Storing Grayscale Data in Analog Form

Two methods are described herein for storing grayscale data in analog format on disks such as those described above: (1) Pit Depth Variation, and (2) Dithering.

Figure 14:
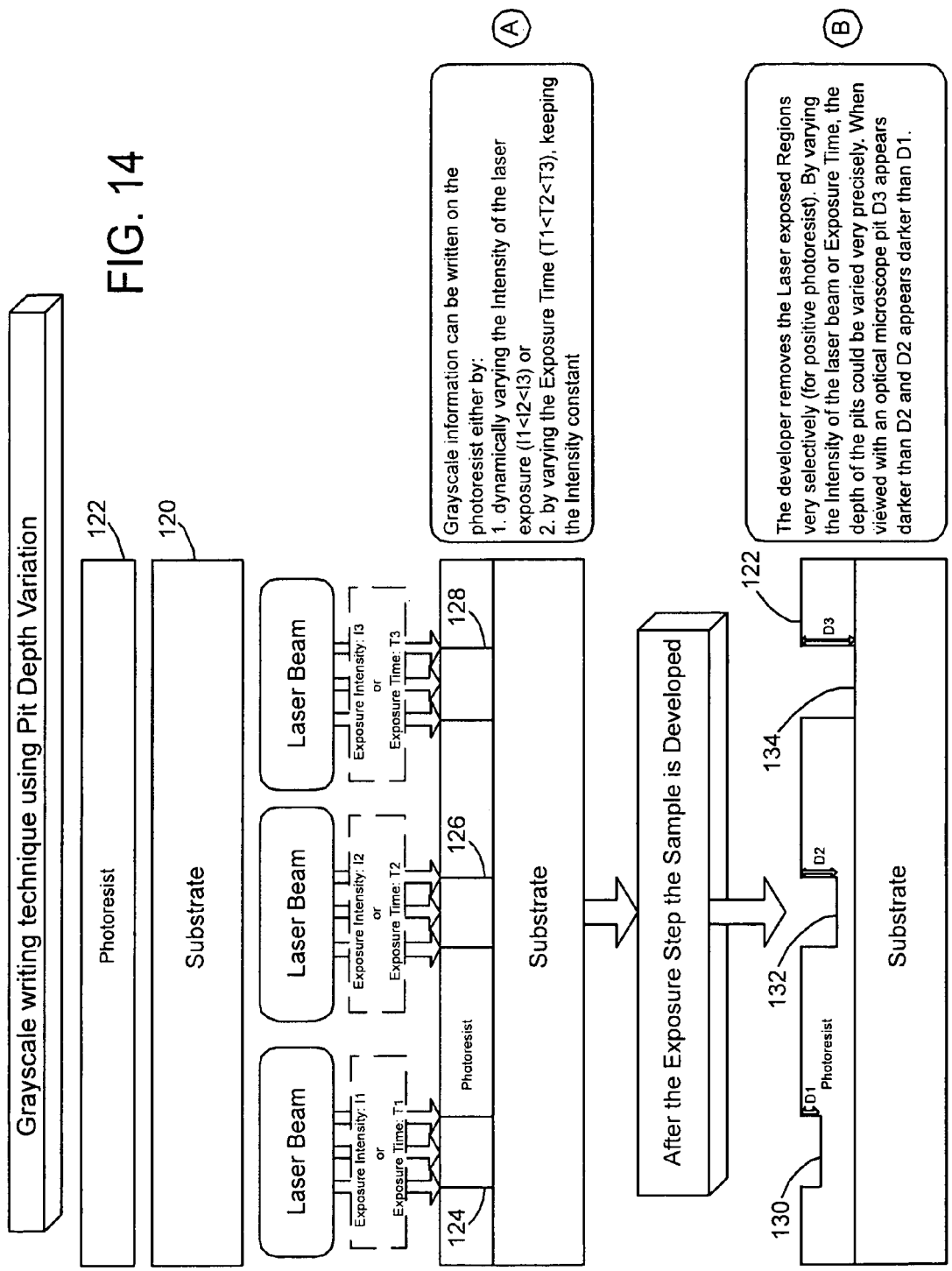
FIG. 14 is a flow diagram illustrating a process for generating grayscale analog images using a pit depth variation technique according to a preferred embodiment of the invention.

Grayscale Data Using Pit Depth Variation (FIG. 14)

Grayscale information can be patterned onto a photosensitive polymer by exposing the polymer to a variation in the intensity or the time of exposure to the laser beam. Start with any suitable substrate 120, which has a coating of photosensitive polymer 122. The photosensitive polymer 122 is then exposed at desired pixel locations 124, 126 and 128 to a controlled amount of directed energy as from a direct write laser (DWL). In FIG. 14, pixel 124 is exposed to a low amount of total energy as determined by the exposure intensity $I_1$ the exposure time $T_1$, or some combination therebetween. Pixel 126 is exposed to a medium amount of energy as determined by the exposure intensity, the exposure time $T_2$, or some combination therebetween. And pixel 128 is exposed to a relatively high amount of total energy as determined by the exposure intensity $I_3$, the exposure time $T_3$, or some combination therebetween where $I_1<I_2<I_3$ and $T_1<T_2<T_3$. The grayscale pattern, consisting of varying pit depths, is transferred in step A to the photoresist by either dynamically varying the intensity of the laser beam or by varying the exposure time of the laser beam.

The substrate is then put through a develop step B (for positive photoresist the laser exposed regions are dissolved away) which exposes the grayscale pattern in the form of varying depths of pits. Pixel 124, receiving the least amount of directed energy, results in formation of a pit 130 formed to depth $D_1$ in photoresist 122. Pixel 126, receiving a medium amount of directed energy, results in formation of a pit 132 formed to depth $D_2$ in photoresist 122. Pixel 128, receiving the most amount of directed energy, results in formation of a pit 134 formed to depth $D_3$ in photoresist 122 where $D_1<D_2<D_3$. When viewed with an optical microscope, deeper pits (e.g. pit 134) appear darker than shallower pits (e.g. pit 130) to thus yield a gray scale-type perspective for the viewer. A copy master or archival stamper (note: these will be in the reverse format) can be created from this substrate by using electrodeposition technique or hot embossing technique described previously. Distribution copies or the archival master can be generated from the copy master or archival stamper using the process described above. Using this process to generate patterned substrates containing grayscale as well as text information requires frontside illumination for reading the data. The reader should be capable of resolving at least 20 levels of gray to display the image information at appropriate resolution.

Grayscale Data Using Dithering Scheme

The word dither refers to a random or semi-random perturbation of the pixel values. It is possible to display a grey-level image in a bilevel device such as monochrome displays and many hardcopy printers by using a technique called image dithering. It consists of mapping the original greyscale image into a binary image. As our eyes perform a spatial integration, it is possible to achieve reasonable results by using a mapping strategy where the gray-intensity values are converted to density of black pixels.

One of the results of dithering is a slight loss of image resolution. This happens because the grayscale blocks are formed from clusters of pixels. For example, an eight-level grayscale requires a 3×3 grid of pixels while a 16-level grayscale requires a 4×4 grid of pixels to represent all levels of brightness. The above patterns are called clustered-dot dithering, because each subsequent pattern turns on or off a pixel that is touching a previously modified pixel. Another form of ordered dot dithering is dispersed-dot dithering where, if possible, the next pixel to be modified is not touching a previously modified pixel. An image modified by either of the dither techniques contains enough information to be usable, but banding and moiré effects can occur.

To overcome these issues, a third dithering method known as the "error diffusion" dither. Error diffusion dithering does not generate banding or moiré effects. It also takes into account the grayscale values of the preceding pixels when determining the proper dither value. However, error diffusion dithering modifies pixels in both the current line and the subsequent line. As with standard threshold dithering, error diffusion dithering can be used to create color dithered images as well as bi-level images.

Use the appropriate dithering scheme to produce the grid of pixels that correspond to the grayscale or color image broken down into its RGB components. The process of transferring a color image to the photosensitive polymer using the DWL system is described in the next section. The pattern is then transferred to the photosensitive polymer over a suitable substrate using the process described in the previous section.

Reproducing Color Information

Figure 15:
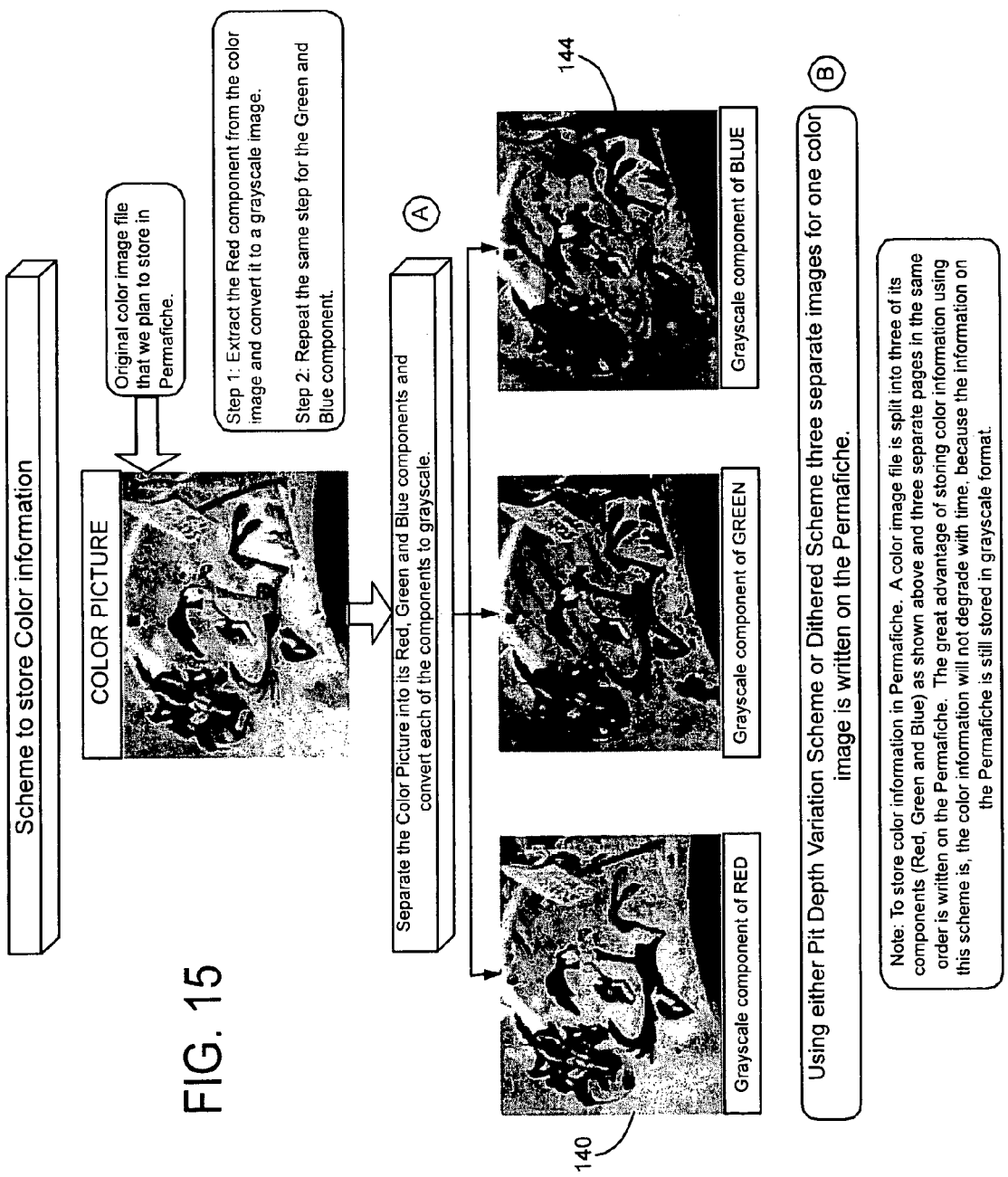
FIG. 15 is a flow diagram illustrating a preferred process for storing color information from grayscale imagery according to a preferred embodiment of the invention.

In a first step, illustrated in FIG. 15, one can use an appropriate algorithm to convert the color image into its RGB components in step A. This generates three separate images: one each for the red 140, green 142 and blue 144 components. The pattern for the three images is then transferred to the DWL system. Each of the red, green and blue images can now be treated as a grayscale image that will be patterned onto the photosensitive polymer (photoresist) over suitable substrate in step B. Transfer the pattern to the photoresist using either the pit depth variation technique or the dithering technique.

Note that the pattern containing the color image occupies three times the space that a grayscale image would occupy on the substrate since three images (for each of the RGB components) have to be written on the substrate The substrate is then put through the develop step (for positive photoresist the laser exposed regions are dissolved away). A copy master or archival stamper can be created from this substrate by using electrodeposition technique or hot embossing technique, described previously. Distribution copies or the archival master can be generated from the copy master or archival stamper using processes described earlier.

Using this process to generate patterned substrates containing color as well as text information requires frontside illumination for reading the data if pit depth variation technique is used. For the dithered scheme described above, either backside or frontside viewing technique could be used. The reader should be capable of using software algorithms to frame grab the RGB component images and combine them to display the color image.

In the current patent application we have disclosed the technique where we expose the photoresist using laser lithography process, develop the photoresist, and than etch into the chrome layer (hard mask). The reason we are following this technique rather than directly milling using laser ablation technique into chrome is mainly because the time it takes to mill directly into metal is much higher than the lithography technique (at least by a factor of 40) and this will drastically slow down the whole archival process.

But as high frequency lasers start coming into the market in the future it is possible we can directly either write into hard mask or even in Archival material in a one-step process. However, such techniques suffer from the following drawbacks:

1. Low throughput
2. Quality of the features is not as good as lithography technique.
3. Involves high energy lasers
4. Lacks control on precise depth of milling Another anticipated technique used for analog data storage is electron beam lithography. We have explored this area too and it is an ideal technique for ultra high-density analog store technique. The process steps are exactly the same as the laser lithography process step. Due to small spot size, much finer features could be exposed. As far as comparing electron beam to ion beam, the electron beams are much faster and superior to ion beam, but for the feature sizes that we are talking about it is much more economical to use laser lithography techniques.

Our substrates to start with are metal or metal oxide thin film coating on glass or quartz or sapphire substrate. One can use focused ion beams to directly etch the data into the thin metal layer but due to Gallium ion implantation the glass/quartz/sapphire substrate properties are changed and it affects the duplication process where UV light is transmitted through the copy master to generate more copies. Electron beam assisted etching of metals or metal oxides thin films using gas chemistry overcomes this problem. Since electron beam doesn't have the mass to sputter the substrate material we are using corrosive gases and the etching process is very localized and only happens where the electron beam impacts the substrate where corrosive gas has been adsorbed.

Step 1: Inject corrosive gas at a localized spot using a gas injection needle. For example: halogen gas for metals and xenon diflouride or metal carbonyls for metal oxide Step 2: Let the gas be adsorbed into the substrate, this process takes few microseconds Step 3: Bombard the localized spot with high-energy electron beam. It initiates the formation of volatile compounds that are sputtered away from the substrate leaving the etched pattern we desire.

Step 4: The corrosive gas adsorption and electron assisted etching continue as long as the metal or the metal oxide layer is not completely depleted from the localize spot where the etching is being conducted.

Another method for ultra-high density analog data storage is the use of lithography techniques such as SCALPEL, which allow further reduction in feature sizes on the patterned substrate while still using a mask with larger patterned features. This technique has been introduced in semiconductor processing to allow patterning of very small features. A brief description of the basics is provided here:

SCALPEL is the acronym for scattering with angular limitation projection electron-beam lithography. This technology is being touted by many to be the next generation lithography that will replace optical techniques from 130 nm down to the 35 nm level. The SCALPEL system utilizes a beam of electrons as the exposure medium rather than the more conventional light sources and relies on the contrast caused when they are scattered at different angles. The mask consists of a membrane of low atomic number material covered by a patterned layer of high atomic number material. Although the mask is essentially transparent to electrons at 100 Kev, a high contrast aerial image is generated at the wafer plane as shown in the accompanying figure. This occurs because very little of the e-beam energy from the highly scattered patterned portion of the mask is allowed through the aperture while most of the weakly scattered electrons from the non-patterned portion of the mask make it through. The magnetic lens system provides a 4:1 demagnified image at the wafer plane. The fact that the mask is transparent and that most of the absorption of energy is at the aperture allows the mask to be relatively immune to thermal instability problems. The extremely thin film required for the masking material means that the mask use a grill of struts to minimize the strain. The images formed by the material between the struts must then be stitched together at the wafer to complete the imaging process. This is a significant challenge for the technology. As electron current is increased, interaction of the scattered electrons can cause blurring of the image, hence limiting the maximum current and throughput. Significant wafer heating could also result which would cause expansion and distortion of the pattern. SCALPEL uses the same type of single-layer chemically amplified resists currently in use for DUV lithography.

Even with the potential difficulties to be overcome with this technology, the market entry costs for the technology could turn out to be reasonable since the mask, resist and processing technologies are similar to those used in optical lithography. SCALPEL is compatible with step-and-scan techniques and therefore holds the promise of good throughput. In addition, excellent overlay accuracy is achievable allowing mix-and-match strategies to be employed. Extensive support from inside the industry makes SCALPEL a strong contender for the 100 nm era and beyond.

Figure 16:
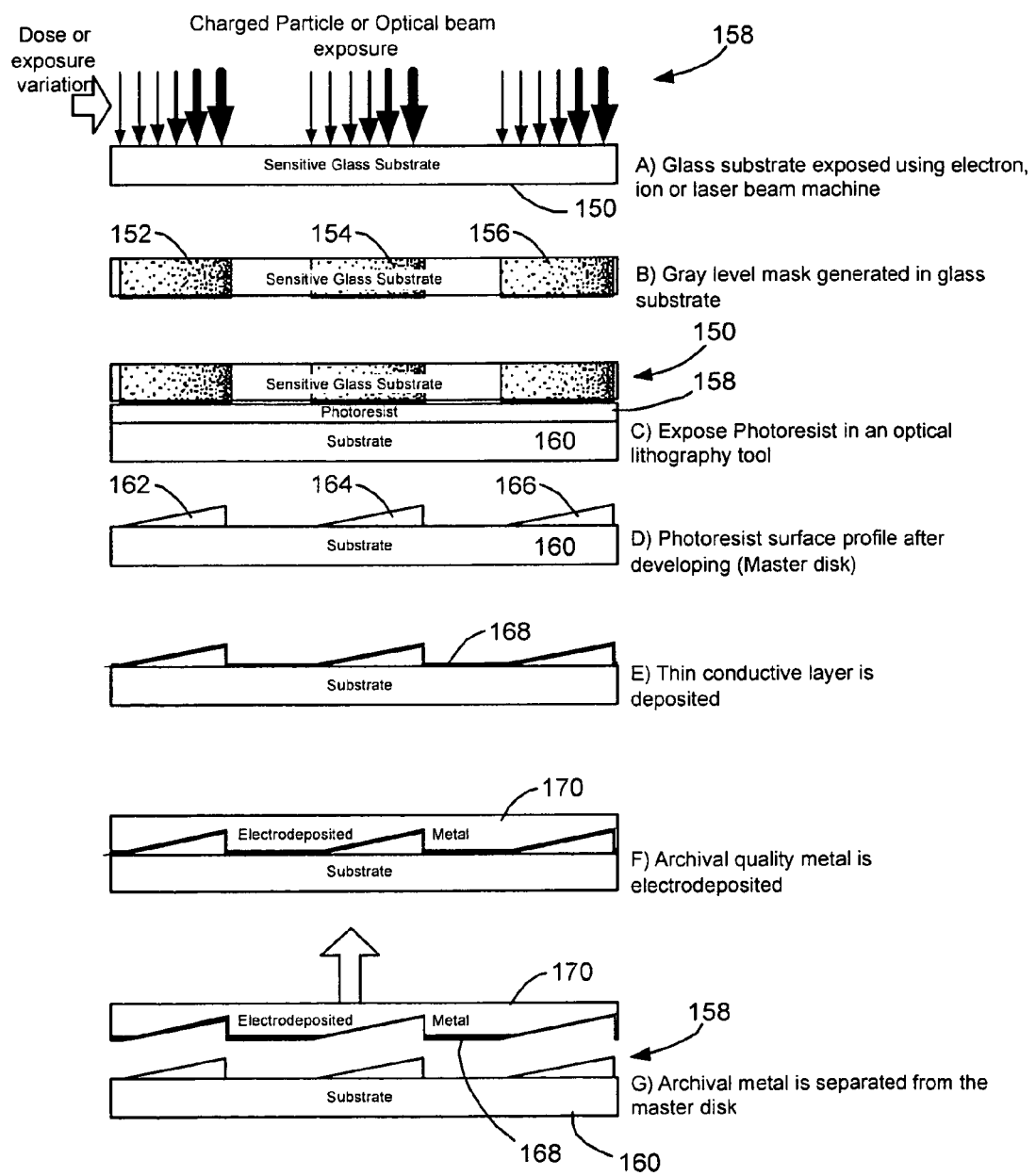
FIG. 16 is a flow diagram illustrating a method for forming three-dimensional data structures on a substrate according to an alternate embodiment of the invention using an energy-sensitive glass mask substrate.

Another method for forming gray scale images by pit depth variation in shown in FIG. 16. A narrowly defined range of Zinc Silicate glass compositions are found to produce High Energy Beam sensitive glass (SG) that possess the essential properties of a true gray level mask, which is necessary for the fabrication of three-dimensional microstructures with one optical exposure in a conventional photolithography process. The essential properties are:

1. A mask pattern or image does not possess grainy-ness even when observed under optical microscope at 1000× or at a higher magnification
2. The sensitive glass (SG) substrate is insensitive and/or inert to photons in the spectral ranges employed in photolithographic processes, and is also insensitive and/or inert to visible spectral range of light so that a SG mask blank and a SG mask are permanently stable under room lighting conditions.
3. The SG is sufficiently sensitive to ion, electron and laser (directed Energy beam) beam exposure.
4. The directed energy beam (either ion, electron or laser) induced optical density is a unique reproducible function of the energy dosages for one or more combinations of the parameters of a writer (ion, electron or laser). The parameters of the energy beam writers include beam acceleration voltage, beam current, beam spot size, addressing grid size and number of retraces.

FIG. 16 illustrates a method of fabricating variable pit depth for analog archival of ultra high resolution gray or color images using SG substrates for 3D profiling of photoresist and reproducing the photoresist replica in the substrate with the existing micro fabrication methods normally used for the production of microelectronics is described below.

Since there is no grainy-ness, SG is capable of resolution to molecular dimensions. SG turns dark instantaneously upon exposure to an energy beam, the more energy dosage the more it darkens. Therefore SG glass is ideal for fabricating gray level masks. SG gray level masks can be written with an ion, electron or laser writer using a 0.1-5 microns addressing grid size, which is based on the spot size of the energy beam used. Every spot in the energy sensitive glass substrate 150 acquires a predetermined transmittance value ranging from 100 percent down to less than 0.1 percent upon energy beam patterning with a predetermined dosage for each address. A gray level mask made of SG does not relay on a halftone method. Therefore, it is a true gray level mask.

In FIG. 16 in step A, an energy beam is directed to portions 152, 154 and 156 of SG substrate 150 with the amount of energy directed at each microscopic location within the portions denoted by the arrows 158 with thicker arrows denoting a dose of more energy. The resulting gray scale photomask created in step B by the energy beam exposure in step A carries patterns, such as at exposed portions 152, 154, and 156, with areas of different transmittance. More directed energy causes a reduced transmittance, as in the far right locations of portions 152, 154, and 156. When the pattern is printed on photoresist 158 in steps C and D, areas of different transmittance in the gray scale mask create areas of different thickness in photoresist 158 after development, for example three-dimensional features 162, 164, and 166 formed on substrate 160. Therefore, a gray scale pattern in a gray scale photomask can be used to create predetermined ultra high resolution gray scale image in photoresist film, which are then transferred into archival quality metal disk using electroplating technique as by first depositing in step E a thin conductive layer 168 over the patterned photoresist, electrodepositing in step F an archival quality metal 170 onto the conductive layer 168, and separating in step G the archival metal 170 from the patterned photoresist and substrate.

The energy beam darkening mechanism of SG includes an intermittence effect in addition to the heat effect. The energy beam darkening mechanism is not known with certainty and is postulated as follows. In the presence of a high energy beam, some of the $Cl^-$ ions and $Ag^+$ ions in the silver halide complex crystal or complex microphases in the integral ion exchanged surface glass layer of a SG plate, react with the energy beam to produce Cl atoms and Ag atoms. Cl atoms and Ag atoms are not stable species and a reverse reaction takes place simultaneously. A third reaction process also occurs simultaneously wherein portions of Cl atoms and Ag atoms become stable species of $Cl_2$ and Silver specks $Ag_n$ (n is an integer) with the help of lattice vibrations. The formation of a silver speck consisting of 2, 3 or more atoms requires the deformation of silver halide lattice to silver lattice. Cycles of lattice vibration of sufficient amplitudes are necessary to cause the formation of the silver specks. Since large amplitudes of lattice vibrational modes exist at higher temperatures, silver specks are formed more quickly at a higher temperature. The variation in the silver speck formation when exposed to high-energy beam leads to darkness variation in the SG substrate.

The typical parameters for an electron beam writer are as follows:
- Accelerating voltage: 1 to 120 kV (ideal: 30 kV)
- Addressing grid size: 0.01 to 0.4 microns (ideal: 0.4 microns)
- Beam current: 25 to 250 na (nano amps) (ideal: 250 na)

The typical parameters for an ion beam writer are as follows:
- Accelerating voltage: 20 to 30 kV (ideal: 30 kV)
- Addressing grid size: 0.1 to 0.4 microns (ideal: 0.4 microns)
- Beam current: 0.3 to 20 na (nano amps) (ideal: 3 na)

And the typical parameters for a laser beam writer are as follows:
- Power: few milli watts to 10 Watts (ideal: 2 W)
- Addressing grid size: 0.1 to 3 microns (ideal: 0.5 microns)
- Wavelength: UV or IR wavelengths (ideal: 248 nm)

Where the commercially available substrate composition is as follows:
- Alkali metal oxide: 11.4-17.5%
- Photosensitivity inhibitors: 2.4-10.2%
- Suppressing agents
  - $TiO_2$: greater than 2.4%
  - $Al_2O_3$: 1.1 to 2.4%
  - $B_2O_3$: 0 TO 4.6%
  - ZnO: 3.7 to 13.2%
  - Cl: 0.5 to 6%
  - $SiO_2$: 58.2 to 78.8%

Archiving from Microfilms

Microfilm/microfiche requires special environmental conditions for storage of the film. Under strict environmental conditions archival quality microfilms can have a life expectancy of ~100 years. Generally microfilm/microfiche may require re-copying into new films in as short a span as 30-50 years based on the storage conditions and handling. Re-copying leads to loss of data due to degradation of resolution.

The current microfilm/microfiche technology available for analog storage for archival purposes does not provide "long-term" (1000+ years) storage of data on durable media capable of withstanding all forms of corrosive environment. Additionally, storage of data on microfilms becomes expensive in the long run due to the requirement for environmental controls and re-copying at the end of life.

Figure 17:
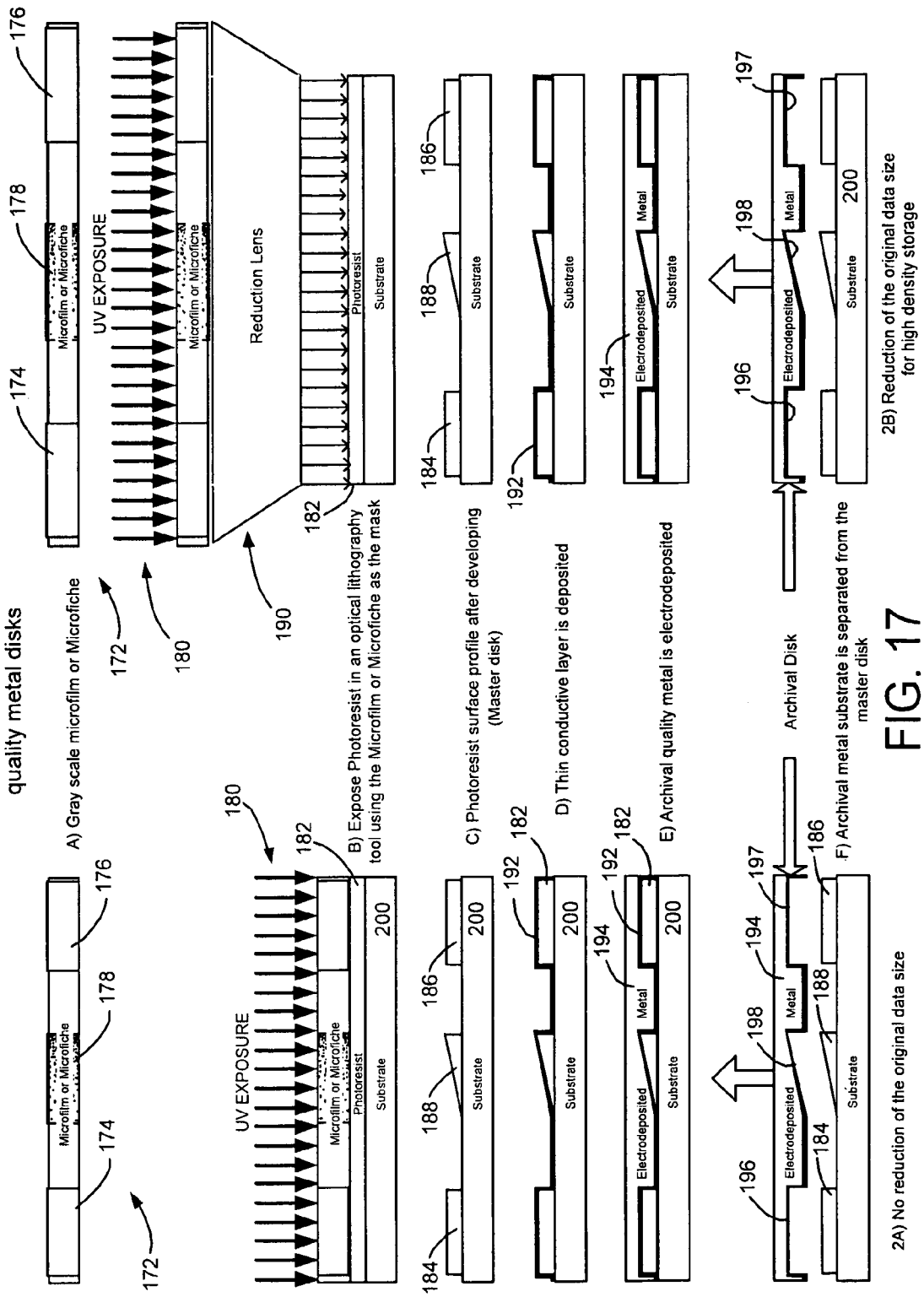
FIG. 17 is a flow diagram illustrating a method for forming three-dimensional data structures on a substrate from an original archiving microfilm/microfiche transfer process according to the invention.

As previously stated the present PermaFiche process technology can extend the life of existing Microfilm and Microfiche to 1000+ years. The process steps for implementing the data transfer from microfilm to a permafiche substrate are shown in FIG. 17. Here we do not need a focused energy beam to direct write the data into the photoresist, instead we use the existing microfilm or microfiche 172, with black regions 174, 176 and gray-scale region 178 as our mask and shine a UV light 180 for a predetermined amount of time to expose the photoresist 182 below the microfilm. Based on the type of photoresist used (positive or negative) the exposed regions will either get washed off or remain during the developing process (FIG. 17 assumes a positive photoresist), thereby forming step features 184, 186 and ramp features 188. The standard semiconductor lithography exposure setup and technique is used. One also has the additional advantage of reducing the page dimension in the original microfilm by a factor of 5, 10 or higher to obtain higher storage density as by using a reduction lens 190. The process steps are as follows:

Step 1 (B): Expose photoresist 182 in an optical lithography tool using the Microfilm or Microfiche 172 as the mask. Preferred UV exposure parameters include using light have a peak spectral emission at 200-500 nm, exposing the photoresist 182 for between about 100 and 500 watts with 200 watts most preferred, for an exposure time of 20 seconds to 2 minutes with 30 seconds most preferred. Exposure can be 1:1 or reduction lens 190 could be used to reduce the physical size of the analog data.

Step 2 (C): In FIG. 17 positive photoresist is used as an example. The exposed regions are removed when developed leaving features 184, 186, 188 on substrate 200. Also if the microfilm or microfiche 172 had true gray scale image 178 we will obtain a etch gradient during the developing process as shown by ramp feature 188. This helps preserve the original data quality in the microfilm or microfiche and stores data in true gray scale.

Step 3 (D): Prior to the electro-deposition process a thin conductive metal layer 192 is deposited on the top surface either using sputtering or electroless technique.

Step 4 (E): Archival quality metal 194 is electrodeposited.

Step 5 (F): The electrodeposited metal layer 194 is then separated out from the substrate 200 to reveal negative features 196, 197, 198 corresponding to positive features 184, 186, 188. The resulting archival metal disk 194 is cleaned in acetone, followed by a thorough rinse in isopropanol and blow dried with nitrogen gas.

Having described and illustrated the principles of the invention in a preferred embodiment thereof, it should be apparent that the invention can be modified in arrangement and detail without departing from such principles. While the above description describes processes for analog data storage for archival purposes, the same process methods can be used for inscribing analog data into any substrate, archival or other, such as jewelry products—diamonds and gemstones, gold pendants, watches, rings, bangles, bracelets—and so forth for the purpose of marking a brand or including other identifying information. An example would be that the processes described herein are used to create jewelry products having inscribed religious texts thereon, such as the bible inscribed on a cross hung as a pendant. I thus claim all modifications and variation coming within the spirit and scope of the following claims.

What is claimed is:

1. A method for defining archival data on an archival material comprising the steps of:
   providing a blank permafiche substrate comprising an archival substrate formed of a material selected from the group consisting of pure nickel or pure nickel embedded with fine diamond powder, and a photoresist layer over the archival substrate;
   exposing portions of the photoresist layer to directed energy only at predefined pixel locations corresponding to a reduced image of an analog data;

removing either the exposed portions or the unexposed portions of the photoresist, termed removed portions of the photoresist, to thereby uncover corresponding portions of the archival substrate located beneath the removed portions of the photoresist;

etching the uncovered corresponding portions of the archival substrate to form an etched pattern in the archival substrate corresponding to the image of the analog data; and removing the photoresist layer.

2. The method of claim 1, wherein the directed energy is of a type taken from the group consisting of focused ion beam, laser, and electron beam.

3. The method of claim 2 wherein the directed energy is laser.

4. The method of claim 1, wherein the method for etching the uncovered corresponding portions of the archival substrate include reverse electroplating the uncovered portions of the archival substrate to form the etched pattern.

5. A method for forming gray scale analog data onto a substrate including a photoresist layer and reading said analog data, the method comprising:

exposing portions of the photoresist layer to directed energy in amounts corresponding to a reduced image of the analog data, wherein areas of said exposed portions exposed to higher amounts of directed energy form darker portions of said reduced image and other areas of said exposed portions exposed to lower amounts of directed energy form lighter portion of said reduced image;

removing portions of the photoresist layer to form pits of varying depths in the photoresist layer corresponding to the amount of energy directed to those exposed portions of the photoresist, the pits forming a three dimensional representation of the gray scale analog data; and optically reading the gray scale analog data through magnification.

6. The method of claim 5, further including the steps of:

mapping the gray scale analog data into a binary image including converting gray-intensity values of the gray scale analog data to a density of pits formed within the substrate; and forming pits within the substrate at a density corresponding to that of the binary image.

7. A method for forming and viewing a color image onto a substrate including a photoresist layer, the method comprising:

resolving a color image into a plurality of gray scale images corresponding to primary colors of the color image;

where, for each of the plurality of gray scale images:

exposing portions of the photoresist layer to directed energy in amounts corresponding to a reduced image of an analog data, wherein areas of said exposed portions exposed to higher amounts of directed energy form darker portions of said reduced image and other areas of said exposed portions exposed to lower amounts of directed energy form lighter portions of said reduced image;

removing portions of the photoresist layer to form pits of varying depths in the photoresist layer corresponding to the amount of energy directed to those exposed portions of the photoresist, the pits forming a three dimensional representation of the gray scale analog data; and optically reading the gray scale analog data for each of the primary colors and combining the images to obtain a full color image.

8. A method for forming and viewing a color image onto a substrate including a photoresist layer, the method comprising:

resolving a color image into a plurality of gray scale images corresponding to primary colors of the color image;

where, for each of the plurality of gray scale images:

exposing portions of the photoresist layer to directed energy in amounts corresponding to a reduced image of an analog data, wherein areas of said exposed portions exposed to higher amounts of directed energy form darker portions of said reduced image and other areas of said exposed portions exposed to lower amounts of directed energy form lighter portions of said reduced image;

mapping the gray scale analog data into a binary image including converting gray-intensity values of the gray scale analog data to a density of pits formed within the substrate; and forming pits within the substrate at a density corresponding to that of the binary image; and optically reading the gray scale analog data for each of the primary colors and combining the images to obtain a full color image.

* * * * *